United States Patent
Jones et al.

(10) Patent No.: US 10,845,848 B2
(45) Date of Patent: *Nov. 24, 2020

(54) FOLDABLE COVER AND DISPLAY FOR AN ELECTRONIC DEVICE

(71) Applicant: Apple Inc., Cupertino, CA (US)

(72) Inventors: Christopher D. Jones, Los Altos, CA (US); Dale N. Memering, Langhorne, PA (US); Christopher C. Bartlow, Menlo Park, CA (US)

(73) Assignee: APPLE INC., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/740,646

(22) Filed: Jan. 13, 2020

(65) Prior Publication Data

US 2020/0150726 A1    May 14, 2020

Related U.S. Application Data

(63) Continuation of application No. 16/408,317, filed on May 9, 2019, now Pat. No. 10,579,105, which is a (Continued)

(51) Int. Cl.
| | | |
|---|---|---|
| G06F 1/16 | (2006.01) | |
| G02F 1/1333 | (2006.01) | |
| G09F 9/30 | (2006.01) | |
| H05K 1/03 | (2006.01) | |
| H05K 1/02 | (2006.01) | |
| H01L 27/32 | (2006.01) | |
| H01L 51/00 | (2006.01) | |

(52) U.S. Cl.
CPC ...... *G06F 1/1652* (2013.01); *G02F 1/133305* (2013.01); *G06F 1/1616* (2013.01); *G06F 1/1618* (2013.01); *G06F 1/1626* (2013.01); *G06F 1/1641* (2013.01); *G09F 9/301* (2013.01); *H05K 1/028* (2013.01); *H05K 1/0306* (2013.01); *G06F 2203/04102* (2013.01); *H01L 27/3244* (2013.01); *H01L 51/0097* (2013.01); *H01L 2251/5338* (2013.01)

(58) Field of Classification Search
CPC ..... F21K 9/00; F21K 9/20; F21K 9/23; F21K 9/27
USPC ........... 362/249.03, 249.04, 249.07, 249.08, 362/249.09
See application file for complete search history.

(56) References Cited

U.S. PATENT DOCUMENTS

| | | |
|---|---|---|
| 6,861,136 B2 | 3/2005 | Verlinden et al. |
| 9,069,521 B2 | 6/2015 | Lee et al. |

(Continued)

FOREIGN PATENT DOCUMENTS

| | | |
|---|---|---|
| EP | 0982121 | 3/2000 |
| WO | WO 00/03870 | 1/2000 |
| WO | WO 2016/073549 | 5/2016 |

*Primary Examiner* — Edwyn Labaze
(74) *Attorney, Agent, or Firm* — Bownstein Hyatt Farber Schreck, LLP

(57) ABSTRACT

Electronic devices including a display layer and a cover layer including a foldable region are disclosed herein. The display layer and the cover layer are configured to be moved between a folded configuration and an unfolded configuration by bending the cover layer along the foldable region. Methods of making a cover layer for an electronic device are also disclosed.

20 Claims, 27 Drawing Sheets

Related U.S. Application Data continuation of application No. 15/870,672, filed on Jan. 12, 2018, now Pat. No. 10,303,218.

(60) Provisional application No. 62/453,014, filed on Feb. 1, 2017.

(56) References Cited

U.S. PATENT DOCUMENTS

| | | |
|---|---|---|
| 9,321,678 B2 | 4/2016 | Chang et al. |
| 9,321,679 B2 | 4/2016 | Chang et al. |
| 9,354,476 B2 | 5/2016 | Han et al. |
| 9,367,095 B2 | 6/2016 | Myers |
| 9,419,065 B2 | 8/2016 | Degner et al. |
| 9,430,184 B2 | 8/2016 | Cho et al. |
| 9,504,170 B2 | 11/2016 | Rothkopf et al. |
| 9,557,874 B2 | 1/2017 | Franklin et al. |
| 9,857,844 B2 | 1/2018 | Tsukamoto |
| 9,935,281 B2 | 4/2018 | Kim et al. |
| 10,254,796 B2 | 4/2019 | Lsa et al. |
| 2008/0212271 A1 | 9/2008 | Misawa |
| 2011/0210937 A1 | 9/2011 | Kee et al. |
| 2013/0010405 A1* | 1/2013 | Rothkopf ............ H04M 1/0216 361/679.01 |
| 2013/0216740 A1 | 8/2013 | Russell-Clarke et al. |
| 2014/0065326 A1 | 3/2014 | Lee et al. |
| 2014/0240985 A1 | 8/2014 | Kim |
| 2015/0004334 A1 | 1/2015 | Bae et al. |
| 2015/0022436 A1* | 1/2015 | Cho ....................... G06F 1/1652 345/156 |
| 2015/0043174 A1 | 2/2015 | Han et al. |
| 2015/0070826 A1 | 3/2015 | Montevirgen et al. |
| 2015/0200375 A1 | 7/2015 | Kim et al. |
| 2015/0210588 A1 | 7/2015 | Chang et al. |
| 2016/0033994 A1 | 2/2016 | Rothkopf et al. |
| 2016/0093240 A1 | 3/2016 | Aurongzeb et al. |
| 2016/0204183 A1 | 7/2016 | Tao et al. |
| 2016/0224238 A1 | 8/2016 | Rothkopf |
| 2016/0326050 A1 | 11/2016 | Lee et al. |
| 2016/0357318 A1 | 12/2016 | Chan et al. |
| 2017/0013729 A1 | 1/2017 | Rothkopf et al. |
| 2017/0036941 A1 | 2/2017 | Lee et al. |
| 2018/0009197 A1 | 1/2018 | Gross et al. |
| 2018/0138442 A1* | 5/2018 | Kim ....................... G06F 3/041 |

* cited by examiner

FOLDABLE COVER AND DISPLAY FOR AN ELECTRONIC DEVICE

CROSS-REFERENCE TO RELATED APPLICATION(S)

This application is a continuation patent application of U.S. patent application Ser. No. 16/408,317, filed May 9, 2019 and titled "Foldable Cover and Display for an Electronic Device," which is a continuation patent application of U.S. patent application Ser. No. 15/870,672, filed Jan. 12, 2018 and titled "Foldable Cover and Display for an Electronic Device," now U.S. Pat. No. 10,303,218, which is a nonprovisional patent application of and claims the benefit of U.S. Provisional Patent Application No. 62/453,014, filed Feb. 1, 2017 and titled "Foldable Cover and Display for an Electronic Device," the disclosures of which are hereby incorporated herein by reference in their entireties.

FIELD

The described embodiments relate generally to bendable or flexible layers for an electronic device. More particularly, the present embodiments relate to bendable covers coupled to a display layer for an electronic device.

BACKGROUND

Traditionally, electronic devices have a single form factor that may be driven by the size and shape of the display. Because many traditional displays are rigid or at least not flexible, a traditional device that is adaptable to accommodate multiple form factors includes the use of a mechanical hinge or pivot joint. However, these traditional configurations used for traditional notebook and tablet devices are inherently limited by the integration and size required by a separate mechanical hinge.

Embodiments described herein are directed to devices and techniques for forming portable electronic devices having a flexible cover coupled to a flexible display that do not have the limitations or drawbacks associated with some traditional solutions.

SUMMARY

Embodiments described herein relate to techniques for forming flexible cover sheets. In particular, cover sheets may be formed to facilitate localized bending or flexing without producing unacceptable levels of internal stress. The embodiments described herein can be used to manufacture cover sheets formed using glass, sapphire, or other ceramic materials.

Additional embodiments described herein relate to electronic devices including flexible cover sheets. The electronic devices may further include a flexible display layer. An example electronic device comprises a display layer and a cover layer coupled to the display layer and defining a foldable region, wherein the display layer and the cover layer are configured to be moved between a folded configuration and an unfolded configuration by bending the cover layer along the foldable region. In embodiments, the foldable region of the cover layer comprises a ceramic material, such as a glass, a metal oxide ceramic, or other ceramic material. In further embodiments, the ceramic material defines at least a portion of an exterior surface of the electronic device.

In some embodiments, the cover layer comprises a continuous layer of a ceramic material. An exterior surface of the continuous layer of ceramic material can define an exterior surface of the electronic device. Such an arrangement can present an impact and/or scratch resistant surface to a user. An opposing interior surface of the continuous layer of ceramic material can face the display layer.

In embodiments, the continuous layer of ceramic material has a substantially uniform thickness. In some embodiments, the continuous layer of ceramic material may be treated to modify the stress state in the layer in order to facilitate folding of the layer. For example, the continuous layer of ceramic material may have a reduced stress condition at an intermediate configuration, between the folded configuration and the unfolded configuration of the electronic device. As another example, the continuous layer of ceramic material may be treated to reduce the tensile stresses in the layer in a folded configuration of the device as compared to a conventional ceramic cover sheet in the same folded configuration.

In additional embodiments, the continuous layer of ceramic material has a variable thickness to facilitate folding of the layer. For example, the continuous layer incorporates one or more relief features on the exterior side, the interior side, or both sides of the layer in the foldable region. A relief feature may provide a locally thinned region of the continuous layer of ceramic material; the continuous layer of ceramic material may also be referred to as a substrate. The cover layer may further comprise a filler material disposed in the relief feature.

In embodiments, an electronic device comprises: a display; a substrate coupled to the display and having a foldable region including a relief feature; and a filler disposed in the relief feature and optically index matched to the substrate, wherein the substrate is configured to move between a folded configuration and an unfolded configuration by folding and unfolding the foldable region. An example cover layer comprises: a substrate having an array of relief features formed into a surface of the substrate; and a filler disposed in the array of relief features and having an optical index that is index matched to the substrate.

In further embodiments, a laminate cover layer comprises a laminate of a continuous layer of ceramic material combined with segments, panels or panel layers of a different material. The continuous layer of ceramic material may be of substantially uniform thickness or of variable thickness. In this arrangement, the continuous layer of ceramic material may be referred to as a base layer for the attached panels. The panels may be arranged over and affixed to an interior side of the continuous layer, facing the display layer. In an example, the panels have a lower stiffness than the continuous layer but have sufficient stiffness to support the continuous layer away from the foldable region. The panels may also have a greater thickness than the continuous layer to support the continuous layer and/or provide impact absorption. A set of panel layers may define a set of gaps. Gaps between the panels may be filled with an additional material having a lower stiffness than the panels to facilitate folding of the cover sheet. In some embodiments, a single gap between two panels defines the foldable region. In other embodiments, the foldable region includes one or more panels; the one or more panels in the foldable region may have at least one dimension (e.g., length and/or width) that is smaller than panels outside the foldable region.

In embodiments, an electronic device comprises: a display and a laminate cover layer coupled to the display and comprising: a ceramic base layer; a set of panel layers arranged over a surface of the ceramic base layer and defining a foldable region, wherein the display and the laminate cover layer are configured to be folded along the foldable region. An example laminate cover layer comprises: a ceramic base layer; a set of panel layers bonded to the ceramic base layer and defining a set of gaps, each gap defined between an adjacent pair of panel layers of the set of panel layers; and a filler material disposed in the each of the set of gaps, the filler material being index matched to at least one of the ceramic base layer or the set of panel layers.

In additional embodiments, a laminate cover layer comprises a laminate of segments, panels, or panel layers of ceramic material combined with a continuous layer of a different material. As an example, the segments of ceramic material may be combined with a continuous layer of a softer material, the continuous layer of the softer material being thicker than the segments of ceramic material. The continuous layer of the softer material may be referred to as the base layer and the panels of ceramic material affixed to the outer side of the base layer. The inner side of this base layer faces the display layer. The foldable region may include one or more panels; the one or more panels in the foldable region may have at least one dimension (e.g., length and/or width) that is smaller than panels outside the foldable region.

In embodiments, an electronic device comprises: a display and a laminate cover layer coupled to the display and comprising: a base layer; a set of ceramic panel layers arranged over a surface of the base layer and defining a foldable region, wherein the display and the laminate cover layer are configured to be folded along the foldable region. An example laminate cover layer comprises: a base layer and a set of ceramic panel layers bonded to the base layer and defining a set of gaps, each gap defined between an adjacent pair of ceramic panel layers of the set of ceramic panel layers. In further embodiments, the set of panel layers is at least partially embedded into the surface of the base layer, and a portion of the base layer fills gaps that are defined between adjacent panel layers of the set of panel layers.

BRIEF DESCRIPTION OF THE DRAWINGS

The disclosure will be readily understood by the following detailed description in conjunction with the accompanying drawings, wherein like reference numerals designate like elements.

Figure 1A:
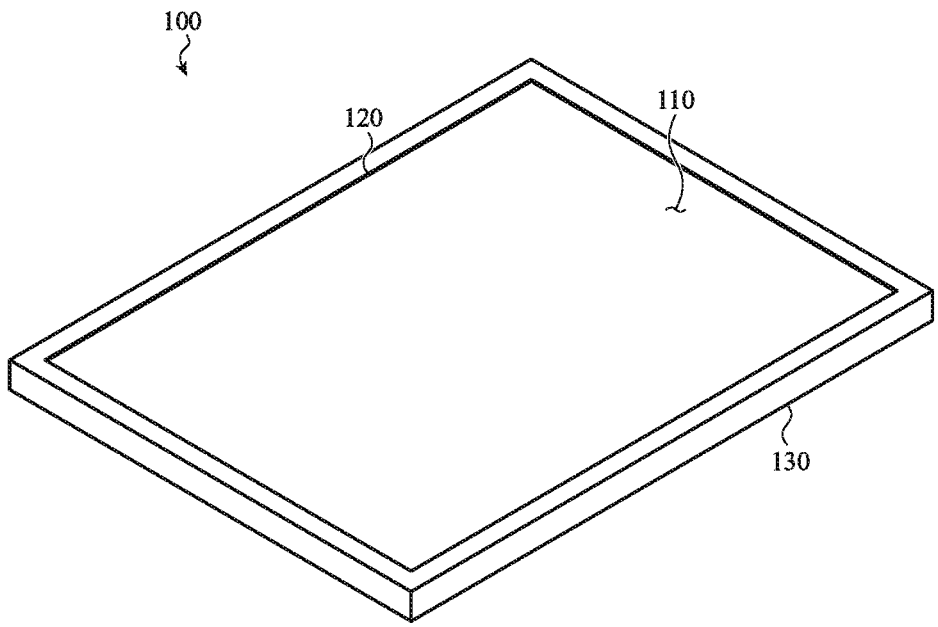
FIGS. 1A and 1B respectively illustrate a device in open and closed configurations.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

The following disclosure relates to electronic devices having a flexible or bendable region. More specifically, the embodiments described herein are directed to an electronic device having a display layer and a cover layer that are configured to fold or bend along a flexible or bendable region. The flexible cover layer may be formed from a ceramic material (e.g., glass, strengthened glass, sapphire, zirconia) to provide some measure of protection for the flexible display from impact or other potential damaging contact. The flexible cover layer may also provide structural support for the display along both the folded and non-folded regions of the device. As used herein, a cover layer may also be referred to as a cover sheet or simply as a cover.

In general, a foldable electronic device can be folded to accommodate a variety of form factors. For example, a foldable electronic device may be used in an unfolded configuration to allow use of an entire display area. The foldable electronic device may also be used in a folded configuration, which may have a more compact size and may also provide a smaller display area. As described in more detail below, a foldable electronic device may be configured to allow multiple folds to provide multiple display arrangements for the electronic device. In some cases, the electronic device can be partially or wholly unfolded to adjust the size of the viewable display area.

Example electronic devices include a display and a cover sheet positioned over the display to provide protection and structural support for the display. The cover sheet may be generally referred to as a cover layer and may include one or more glass or other ceramic layers. The display may be generally referred to herein as a display layer, which may include various elements that are configured to produce a dynamic visual output. An example display layer may include a liquid crystal display (LCD), an organic light emitting diode (OLED) display, an active layer organic light emitting diode (AMOLED) display, an electrophoretic (electronic ink) display, or other similar type of display components. In some embodiments, the display layer may be coupled to the cover layer using an adhesive layer, cladding layer, or other bonding agent. The electronic device may also include one or more additional device elements that are coupled to the display layer and cover layer. As described in more detail herein, the additional device elements may include a battery, circuit boards, circuit substrates, backing layers, and/or housing elements.

The display may be configured to bend or fold along a flexible or bendable region of a foldable electronic device. Flexible displays include, but are not limited to, thin film transistor (TFT) displays, LCD display, and OLED displays that are formed from one or more flexible layers. In particular, the display may include or be integrated with various layers, including, for example, a display element layer, display electrode layers, a touch sensor layer, a force sensing layer, and the like, each of which may be formed using flexible substrates. For example, a flexible substrate may be formed from a polyimide, PEEK, Mylar or other similar type of material. The flexible substrate may have one or more layers of conductive elements or traces that route electrical signals to electronic components positioned along the flexible substrate.

In some embodiments, information regarding configuration and/or orientation of the electronic device may be used to control the output of the display. Example sensors include accelerometers, gyroscopes, magnetometers, and other similar types of position/orientation sensing devices. Such information may be provided by one or more sensors that are operably coupled to processing circuitry, which controls the display based on the sensor signals. For example, a portion of a display may be turned off, disabled, or put in a low energy state when the device is transitioned from an unfolded position to a folded configuration. This may be useful when a portion of the display is not visible on a part of the display when the device is in a folded or partially folded position. Similarly, the display may be adapted to display graphical output in a rotated mode (e.g., from landscape to portrait mode) depending on whether the device is in an unfolded or folded configuration, which may change the overall aspect ratio of the viewable area of the display. The display output may also be re-oriented based on the changes in orientation of the device.

Example display and cover layers may include a foldable region that is configured to fold or bend about the region. In some embodiments, the display and/or cover layers are configured to allow localized folding or bending such that the fold occurs over only a portion of the layer. For example, an arc length of the fold or bend may be less than a length or width of the display or cover layer. In some cases, a foldable region is positioned between two non-folding regions. The non-folding regions may have a flat, arced, contoured or virtually any other type of shape. However, the non-folding regions may be generally configured to maintain a consistent or static geometric shape or form when the device is folded and unfolded.

Several parameters can be used to describe the geometry of folds or bends in sheet components. In general, a fold or bend may be characterized at least in part by the minimum radius of curvature as measured, for example, on the inside surface of the device element. Example radii of curvature include, but are not limited to, radii less than 25 mm, less than 15 mm, less than 10 mm, from 1 mm to 25 mm, from 2 mm to 25 mm, from 1 mm to 10 mm, from 2 mm to 10 mm, from 2 mm to 7 mm, or from 5 mm to 15 mm. In addition to or as an alternative to describing a bend as having a radius of curvature, a bend or fold may be measured or characterized as the distance between the endpoints of the fold or bend. In an example, the fold or bend can be characterized by a bend width, which may be measured between two points on the inner surface of the device when the device is in a folded configuration. Further, the fold or bend can also be characterized by an inclusive angle defined by the bend.

As an example, a portion or component of the device may be folded back onto a common plane or direction, which could be described as a bend angle of about 180°. As an additional example, the bend angle in the folded configuration may be in the range from 135 degrees to 180 degrees. As referred to herein, a bend axis is a virtual line that defines the center around which the device or component of the device is bent.

Figure 6A:
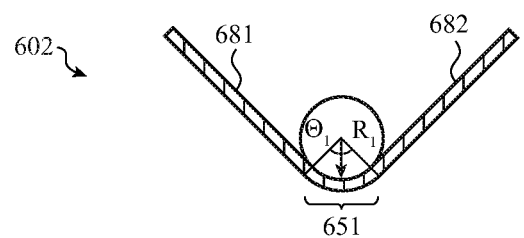
FIG. 6A illustrates a side view of a sheet component preformed to a preliminary shape and annealed.
Figure 6B:
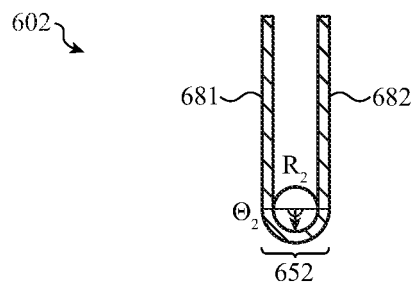
FIG. 6B shows the sheet component of FIG. 6A in a folded position.

As described herein, a foldable electronic device may have a cover layer that is coupled to a display layer or element. In general, a cover layer may be characterized as having two generally opposing sides or faces, with at least one edge joining the sides or faces. An inward facing side of the cover may face the display, and an outward facing side of the cover may face a user in some configurations of the device. In addition, when a foldable region of the cover layer is folded or bent, one side of cover layer forms the inner surface or portion of the folded/bent region (also referred to as the inside of the fold or bend) and the other side of the cover layer forms the outer surface or portion of the folded/bent region (also referred to as the outside of the fold or bend). The radius of curvature and/or the bend width of the folded/bent region may be measured from the inside surface as illustrated in FIGS. 6A and 6B and described below.

In some embodiments, a cover layer suitable for use with the electronic devices disclosed herein includes one or more ceramic layers or substrates. The ceramic layers or substrates may have a substantially uniform thickness or may vary in thickness as illustrated in embodiments described herein. In some embodiments, the thickness of the ceramic layer or substrate ranges from 25 µm to 400 µm. In additional embodiments, the thickness of the ceramic layer or substrate is from 1 µm to 20 µm, from 5 µm to 15 µm, or from 1 µm to 10 µm. As used herein, the terms "ceramic," "ceramic material," and "ceramic layer" may be used to describe materials having both crystalline and amorphous inorganic materials. Example ceramics include, but are not limited to, metal oxide-based materials. Metal oxide-based materials include, but are not limited to, silica-based materials (e.g., glasses such as aluminosilicate and borosilicate glasses), alumina-based materials (e.g., single-crystalline and polycrystalline sapphire), zirconia-based materials, and mixed metal oxides such as spinel-based materials (e.g., magnesium aluminum oxide). As used herein, ceramics do not include bulk materials that may be characterized as metals and metal alloys. However, a ceramic may include a metal or metal alloy as a constituent component or applied to the surface of the ceramic. In some embodiments, the ceramic layer or ceramic material is optically transparent. For example, the optical transmissivity of the ceramic layer or ceramic material is at least 90%. In some embodiments, the ceramic layer or ceramic material is translucent or otherwise able to transmit or pass light. As examples, ceramic layers of substantially uniform thickness may have a thickness that is uniform to within +/−5% or +/−10%.

For a cover layer including a continuous ceramic layer, the electronic device may be folded so that the continuous ceramic layer is on the inside or the outside of a given fold. If the continuous ceramic layer is on the inside of a fold, the exterior surface of the continuous ceramic layer will be on the inside of the fold. Conversely, if the continuous ceramic layer is on the outside of a fold, the exterior surface of the continuous ceramic layer will be on the outside of the fold. In either configuration, the ceramic layer may define an exterior surface of the electronic device over the fold or foldable region.

In some embodiments, a continuous ceramic layer may be treated to have a reduced stress condition at an intermediate configuration, between the folded configuration and the unfolded configuration of the electronic device. As an example, the foldable region of the continuous ceramic layer may be treated so that a first portion of a foldable region located at the inside of the fold in the folded configuration has a first compressive stress in the folded configuration; a second portion of the foldable region located at the outside of the fold in the folded configuration has a second compressive stress in the unfolded configuration; the first portion has a third compressive stress in an intermediate configuration, between folded and unfolded configurations, that is less than the first compressive stress; and the second portion has a fourth compressive stress in the intermediate configuration that is less than the second compressive stress. In some cases, the first and second portions of the ceramic layer may have a minimum stress condition (whether tensile or compressive) when the ceramic layer is in the intermediate configuration, between the folded and unfolded configurations. As a further example, the continuous ceramic layer may be treated so that the maximum tensile stress in the ceramic layer when the ceramic layer is in the folded condition is at least 20%, 30%, or 40% lower than an untreated equivalent ceramic layer in the folded condition.

In additional embodiments, a cover layer comprises a substrate comprising a continuous ceramic layer and relief features formed into the substrate. As examples, a relief feature may have a depth that is at least 10%, 20% or 30% of the substrate thickness. A relief feature may provide a locally thinned region that generally extends across the foldable region. As examples, the minimum thickness of the continuous layer in the locally thinned region may be 10%, 20%, 30% or 40% of the thickness away from the locally thinned region. In addition, a relief feature may provide a locally thinned region that does not extend across the foldable region. As an example, multiple relief features may in combination generally extend across the foldable region. Further, a relief feature may take the form of a notch-shaped feature located near an edge of the foldable region; when the foldable region is in the folded position, the relief feature may located at a corner or other transition region of the bend.

In many embodiments, the cover layer includes a translucent or transparent ceramic layer, and the relief features may be filled with a filler material that is optically index matched to the translucent substrate. For example, the filler material may have an optical index of refraction or an optical index of reflection that closely approximates that at the substrate under normal operating or use conditions. In some instances, a filler material that is index matched may be characterized as having an optical index (e.g., reflection, refraction) that is substantially matched to that of the substrate or other nearby material. The substrate may comprise a ceramic material and the filler material may include a polymer having suitable optical properties for being index matched and suitable mechanical properties to provide strain relief during bending or folding. For example, the polymer may be an acrylate or a silicone polymer. The polymer may be an adhesive, such as an optically clear adhesive, or a polymer other than an adhesive. Optically clear adhesives include, but are not limited to, acrylate-based and silicone-based adhesives.

In additional embodiments, a cover layer comprises multiple layers. For example, the cover layer comprises a continuous ceramic outer layer and inner layer segments or panels bonded to the outer layer and defining a gap between at least one pair of inner layer segments or panels, with a filler material being disposed in the gap. The inner layer(s) may be of a material that is more pliable than the material of the outer layer. For example, the outer ceramic layer may be a glass, such as a chemically strengthened glass, or an oxide ceramic. Suitable inner layers for glass ceramic layers include polymer materials. Suitable inner layers for metal oxide ceramic layers include glasses, polymers or combinations thereof. For example, the polymer may be an acrylate or a silicone polymer. Suitable materials for the filler material include adhesive polymer materials, such as optically clear adhesives. The filler material may be selected to have an optical index of refraction that is index matched or substantially matched to at least one of the outer layer and the outer layer. As an example, a thickness of the segments or panels of the inner layer may be at least 125% of the thickness of the outer layer. In examples, the segments or panels of the inner layer have a thickness from two to ten times or two to five times a thickness of the outer layer.

As another example, the cover layer comprises a continuous inner layer and ceramic outer layer segments or panels bonded to the outer layer and defining a gap between at least one pair of the ceramic outer layer segments or panels. A set of the panels of the outer layer may define a set of gaps. The inner layer may be of a material that is more pliable than the material of the outer layer. For example, the outer ceramic layer may be a glass, such as a chemically strengthened glass, or an oxide ceramic. Suitable inner layers include polymer materials. For example, the polymer may be an acrylate or a silicone polymer. As an example, a thickness of the inner layer may be at least 125% of a thickness of the segments or panels of the outer layer. In examples, the inner layer has a thickness from two to ten times or two to five times a thickness of the segments or panels of the outer layer.

These and other embodiments are discussed below with reference to FIGS. 1A-26. However, those skilled in the art will readily appreciate that the detailed description given herein with respect to these figures is for explanatory purposes only and should not be construed as limiting.

Figure 1B:
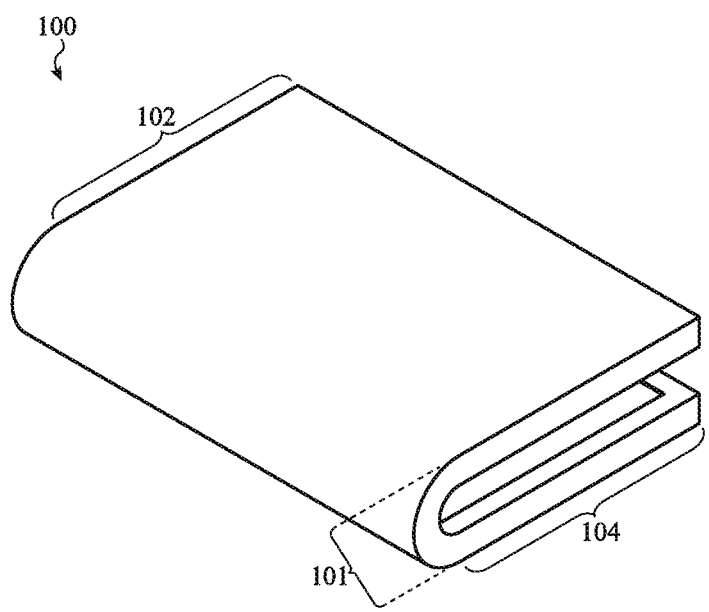

FIGS. 1A and 1B depict a simplified example of a foldable electronic device. FIG. 1A depicts the device 100 in an unfolded configuration and FIG. 1B depicts the device 100 in a folded configuration. The unfolded configuration may be referred to as an open configuration and the folded configuration may be referred to as a closed configuration. As described with respect to other examples provided herein, a device may include multiple folds and may include more than two configurations (e.g., folded, partially folded or unfolded, and unfolded).

As shown in FIG. 1A, the device 100 includes a display 120 that is viewable through a first side of the device 100. A cover 110 is positioned over the display 120 and is generally formed from a translucent or transparent material or substrate. The device 100 may also include a housing 130 that forms at least a portion of an exterior surface of the device 100. In some implementations, the housing 130 at least partially surrounds the display 120. In some implementations, the housing 130 forms a backing or backing layer along a back surface of the display 120. In some cases, the housing 130 is optional or is integrally formed with the display 120 and cover 110.

FIG. 1A depicts the device 100 in a flat or unfolded configuration. In accordance with embodiments described herein, the cover 110, display 120, and optional housing 130 may be folded or bent into one or more folded configurations. In general, the device 100 may operate in a different state or provide different functionality when folded and unfolded. In the example of FIGS. 1A and 1B, the device 100 may be operated in an interactive mode when unfolded as shown in FIG. 1A and may be in a standby, power saving, or off mode when in the folded configuration shown in FIG. 1B.

As shown in FIG. 1B, the device may define various regions. Specifically, the device 100 may include a folded or foldable region 101, which forms or defines an edge or side of the device 100 when the device is in the folded configuration, as shown in FIG. 1B. The folded or foldable region 101 may extend between a first non-foldable region 102 and a second non-foldable region 104. While the first and second non-foldable regions 102 and 104 are depicted as flat, it is not necessary that they be flat or planar in shape. In general, the shape of the non-foldable regions 102 and 104 does not change or is substantially static between the folded and unfolded configurations of the device 100.

In the example of FIGS. 1A and 1B, the display 120 and cover 110 are not exposed when the device 100 is in the folded configuration (as depicted in FIG. 1B). This may help protect the display 120 and the cover 110 when the device is not in use and may be moved or transported. In an alternative configuration, the device 100 may be folded or bent in an opposite manner resulting in the display 120 and cover 110 being positioned along an externally facing surface of the device 100 when the device is in the folded configuration. This may allow the user to view and/or interact with the device 100 in the folded configuration.

FIGS. 2A-5C depict additional example configurations in which the device includes one or more foldable regions. As depicted in the following examples, the device may include multiple folds or bends. Each fold or bend may be configured to fold in a particular direction and have a particular bend radius. For example, when a device has two foldable regions, a first localized bend is formed in a first foldable region and a second localized bend is formed in a second foldable region. In some embodiments, a ratio of a first bend angle of the first localized bend to a second bend angle of the second localized bend is from 0.3 to 0.7. The ratio between multiple bend regions may allow the device to be folded over onto itself as depicted in the example of FIGS. 4A-4C and 5A-5C. Additionally, the device may be configured to have multiple configurations including, for example, a folded configuration, one or more partially unfolded/folded configurations, and an unfolded configuration. While the unfolded configurations of the following examples are depicted as being flat, it is not necessary that the device be flat or planar in shape in an unfolded configuration.

The devices shown in FIGS. 2A-5C include a cover layer, a display layer, and a backing layer, each of which allows folding of the device in the foldable region(s). Example cover layers include at least one cover layer foldable region comprising a ceramic material. The ceramic material at least partially defines an exterior surface of the electronic device. As shown, the display layer and the backing layer extend across the foldable region and are sufficiently flexible to generally conform to the shape of the cover layer in a folded configuration of the device. The display layer and/or the backing layer may be generally flexible or may include a foldable region aligned with the foldable region of the cover layer. The foldable region of the display layer may be capable of presenting output to a user so that the display is viewable over the fold or bend. Flexible display layers and backing layers are described in more detail with respect to FIG. 26.

Figure 2A:
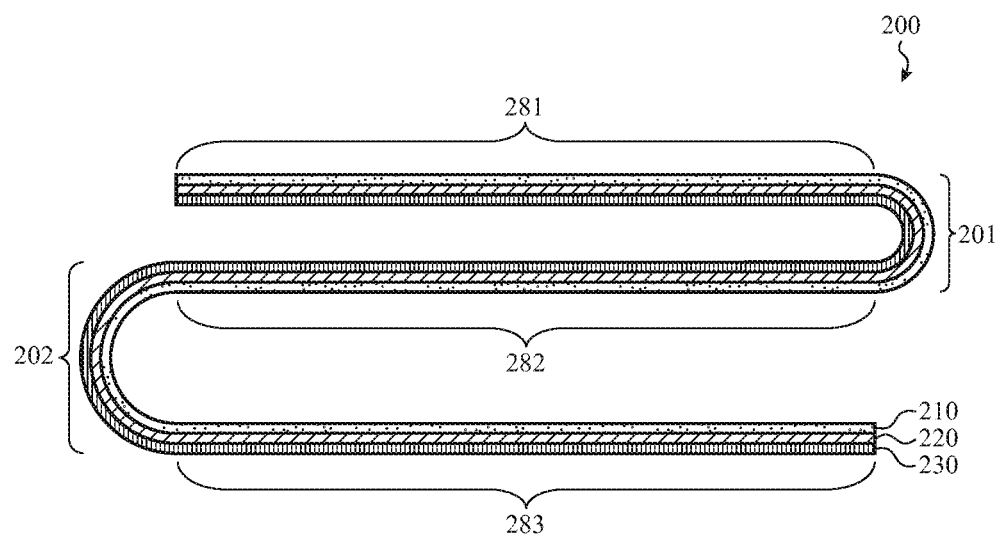
FIGS. 2A, 2B, and 2C respectively show cross-sectional views of a device in folded, partially unfolded, and unfolded configurations.
Figure 2B:
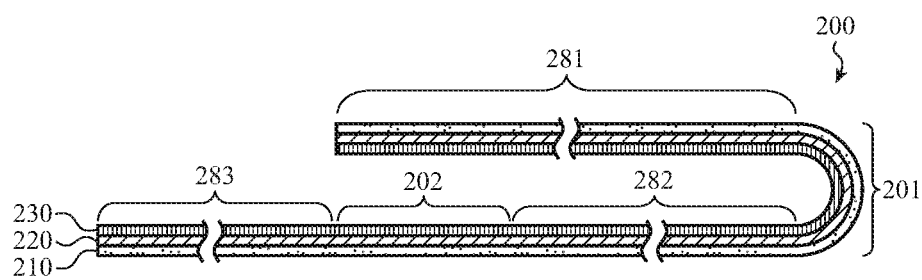
Figure 2C:
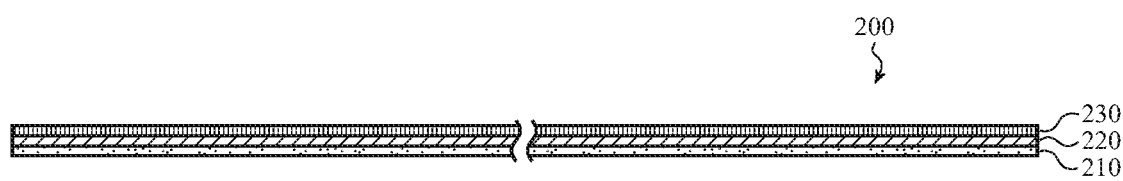

FIGS. 2A-2C are cross-sectional views of a device 200 having two opposing bends to form an s-shaped folded configuration. As shown in FIGS. 2A-2C, the device 200 includes a cover layer 210, a display layer 220, and a backing layer 230. The cover layer 210 may be formed from one or more ceramic layers where at least one of the layers defines an external surface of the device 200. The cover layer 210 may be formed from a translucent or transparent material. In general, the display layer 220 may be viewable through sides or surfaces of the device 200 having the cover layer 210 and not viewable though surfaces or side of the device 200 having the backing layer 230. While the following examples are provided with respect to a single-sided display device, the same principles and embodiments may be extended to double- or dual-sided display devices.

FIG. 2A depicts the device 200 in a fully folded or closed configuration. In the fully folded or closed configuration, roughly a third of the display layer 220 is viewable along a first region 281 of the device 200. The display layer 220 is also viewable along a first foldable region 201 of the device 200 located along the right edge, as shown in FIG. 2A. The cover layer 210 is on the exterior of the device on first region 281 and first foldable region 201. In the fully folded or closed configuration, the display layer 220 is not viewable along the second region 282 and third region 283 because those regions are folded over themselves with the display layer 220 facing inward. Also for the second region 282 and the third region 283, the cover layer 210 is generally protected.

As shown in FIG. 2A, a second foldable region 202 extends between the second region 282 and the third region 283. In this particular example, the second foldable region 202 has a larger bend radius than the first foldable region 201. The second foldable region 202 is also configured to bend in an opposite direction than the first foldable region 201. In some implementations, the shape or curvature of the second foldable region 202 may be different from the shape or curvature of the first foldable region 201.

FIG. 2B depicts a partially unfolded (or partially folded) configuration of the device 200. The partially unfolded configuration may be formed after the third region 283 is rotated as indicated to straighten or unfold the second foldable region 202. As shown in FIG. 2B, roughly a third of the display layer 220 remains viewable along a first region 281 of the device 200. However, as shown in FIG. 2B, the second foldable region 202 is in an unfolded state or configuration, which unfolds the third region 283 away from the second region 282. In this state or configuration, roughly two thirds of the display layer 220 is viewable along the bottom or opposite side of the device 200. A portion of the display layer 220 also remains visible along the first foldable region 201.

FIG. 2C depicts a fully unfolded state or configuration of the device 200. As shown in FIG. 2C, the entire display layer 220 is viewable along a single side of the device. As previously mentioned, while the device 200 is depicted as being flat in the unfolded state or configuration, it is not necessary that the device have a perfectly flat or planar shape in the fully unfolded configuration.

With respect to each of the configurations of FIGS. 2A-2B, the device 200 may be configured to operate in different modes for each configuration. For example, the device 200 may be configured to adapt the display layer 220 to only display information along portions or regions that are viewable to a user in a particular configuration. The device 200 may be configured, for example, to display only a portion or a scaled display for configurations in which a reduced area is visible. The device 200 may also be configured to present different interfaces for different viewable portions of the display layer 220 depending on whether the portions are viewable on the front or back of the device 200. FIG. 2B depicts an example of such a dual display configuration.

Figure 3A:
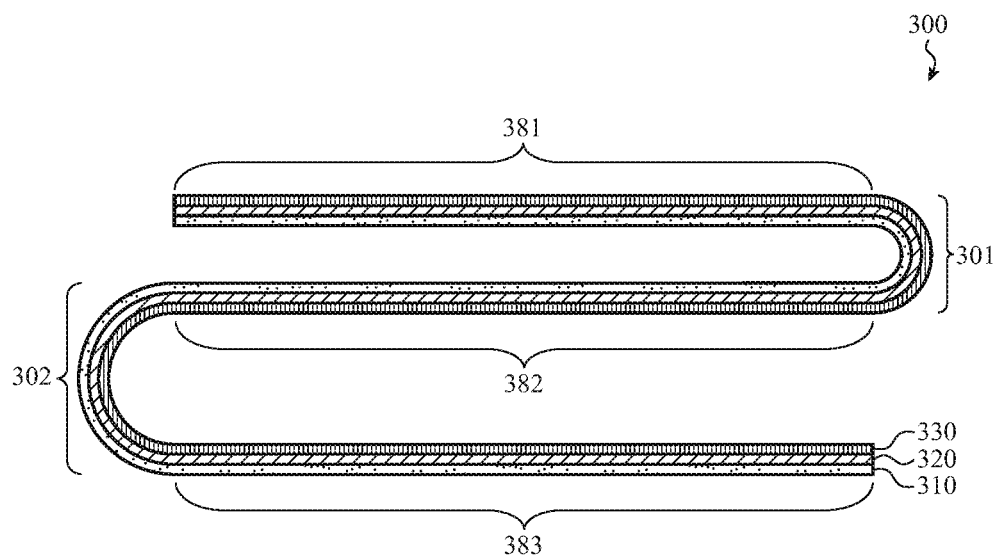
FIGS. 3A, 3B, and 3C respectively show cross-sectional views of another device in folded, partially unfolded, and unfolded configurations.
Figure 3B:
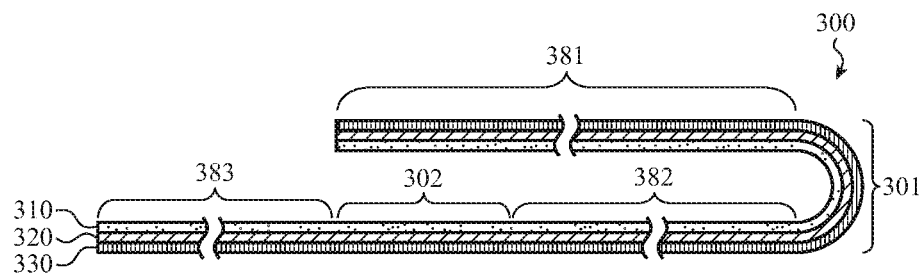
Figure 3C:
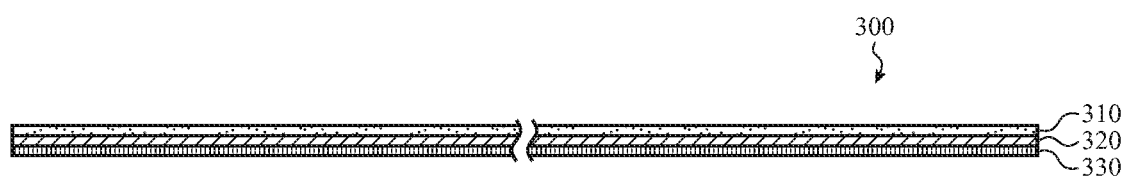

FIGS. 3A-3C are cross-sectional views of another such device 300 having two opposing bends at different heights to form an s-shaped folded configuration. As shown in FIGS. 3A-3C, the device 300 includes a cover layer 310, a display layer 320, and a backing layer 330. Similar to the previous example, the cover layer 310 may include one or more translucent or transparent ceramic layers that define an exterior surface of the device 300.

FIG. 3A depicts the device 300 in a fully folded or closed configuration. In the fully folded or closed configuration, roughly one-third of the display layer 320 is viewable along a third region 383 of the device 300. The display layer 320 is also viewable along a second foldable region 302 of the device 300 located along the left edge, as shown in FIG. 3A. The cover layer 310 is on the exterior of the device on the third region 383 and second foldable region 302. In the fully folded or closed configuration the display layer 320 is not viewable along the first and second regions 381 and 382 and the first foldable region 301; the cover layer 310 is generally protected in these regions.

As shown in FIG. 3A, the second foldable region 302 has a larger bend radius than the first foldable region 301. The second foldable region 302 is also configured to bend in an opposite direction than the first foldable region 301.

FIG. 3B illustrates a partially unfolded configuration (or partially folded) configuration of the device 300. The partially unfolded configuration may be formed after the third region 383 is rotated as indicated to straighten or unfold second foldable region 302. As shown in FIG. 3B, roughly one-third of the display layer remains viewable along third region 383 and second foldable region 302.

FIG. 3C depicts a fully unfolded configuration of the device 300. As shown in FIG. 3C, the entire display layer 320 is viewable along a single side of the device; as shown, this is the front side of the device. As previously mentioned, while the device 300 is depicted as being flat in the unfolded state, it is not necessary that the device have a perfectly flat or planar shape in the fully unfolded configuration. As previously discussed for device 200, device 300 may be configured to operate in different modes for each configuration shown in FIGS. 3A-3B.

Figure 4A:
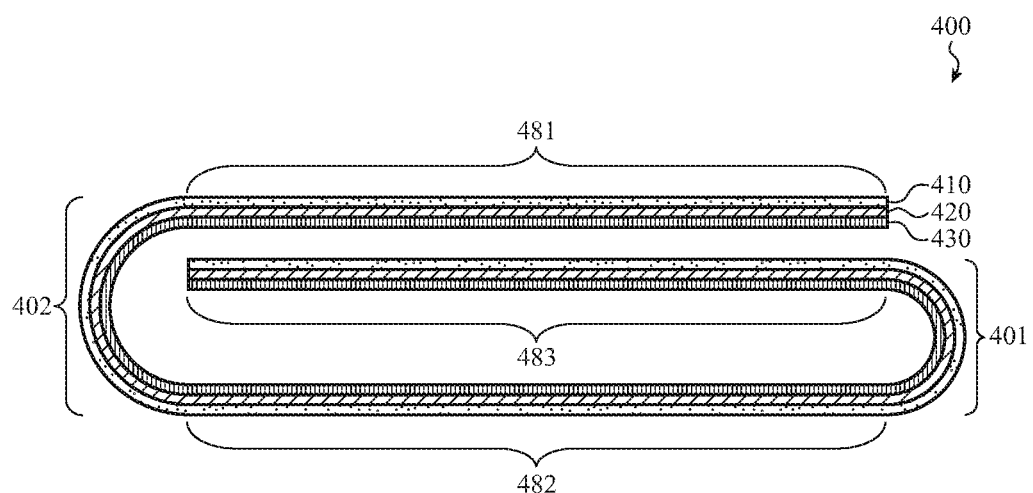
FIGS. 4A, 4B, and 4C respectively show cross-sectional views of another device in folded, partially unfolded, and unfolded configurations.
Figure 4B:
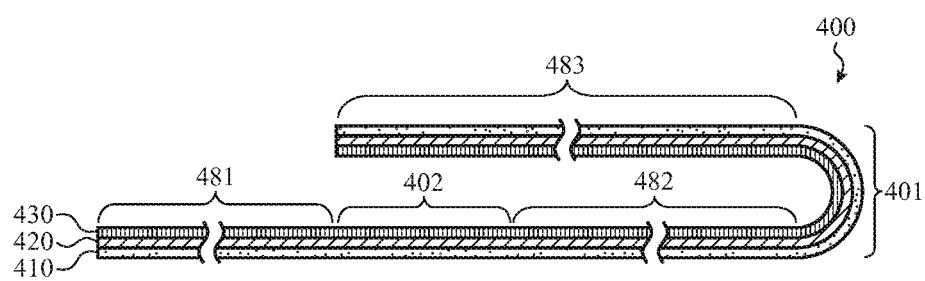
Figure 4C:
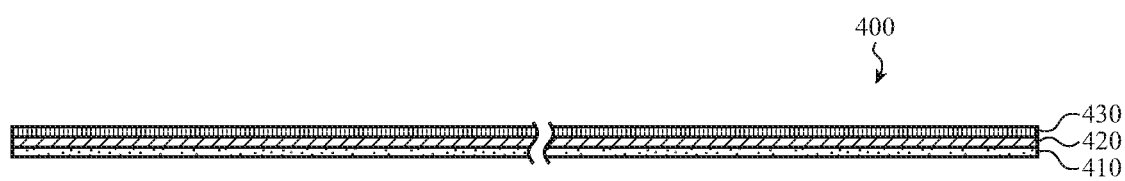

FIGS. 4A-4C show cross-sectional views of a device 400 having two opposing bends which face each other in the fully folded configuration. As shown in FIGS. 4A-4C, the device 400 includes a cover layer 410, a display layer 420, and a backing layer 430. Similar to the previous example, the cover layer 410 may include one or more translucent or transparent ceramic layers that define an exterior surface of the device 400.

FIG. 4A depicts the device 400 in a fully folded or closed configuration. In the fully folded or closed configuration, roughly two thirds of the display layer 420 is viewable along the first region 481 and second region 482 of the device 400. The display layer 420 is also viewable along the first and second foldable regions 401, 402 of the device 400. The cover layer 410 is on the exterior of all regions of the device 400 except third region 483.

As shown in FIG. 4A, the first foldable region 401 has a smaller bend radius than the second foldable region 402, which allows first region 481 to overlap third region 483. The first foldable region 401 is configured to bend in an opposite direction than the second foldable region 402.

FIG. 4B illustrates a partially unfolded (or partially folded) configuration of the device 400. The partially unfolded configuration may be formed after the first region 481 is rotated as indicated to straighten or unfold second foldable region 402. As shown in FIG. 4B, roughly one-third of the display layer 420 is viewable from the top of the device 400 along third region 483. Roughly two thirds of the display layer 420 is viewable from the bottom of the device 400, including along first and second regions 481 and 482 and first foldable region 401.

FIG. 4C depicts a fully unfolded configuration of the device 400. As shown in FIG. 4C, the entire display layer 420 is visible along a single side of the device; as shown, this is the back side of the device. As previously mentioned, while the device 400 is depicted as being flat in the unfolded configuration or state, it is not necessary that the device have a perfectly flat or planar shape in the fully unfolded configuration. As previously discussed for devices 200 and 300, device 400 may be configured to operate in different modes for each configuration shown in FIGS. 4A-4B.

Figure 5A:
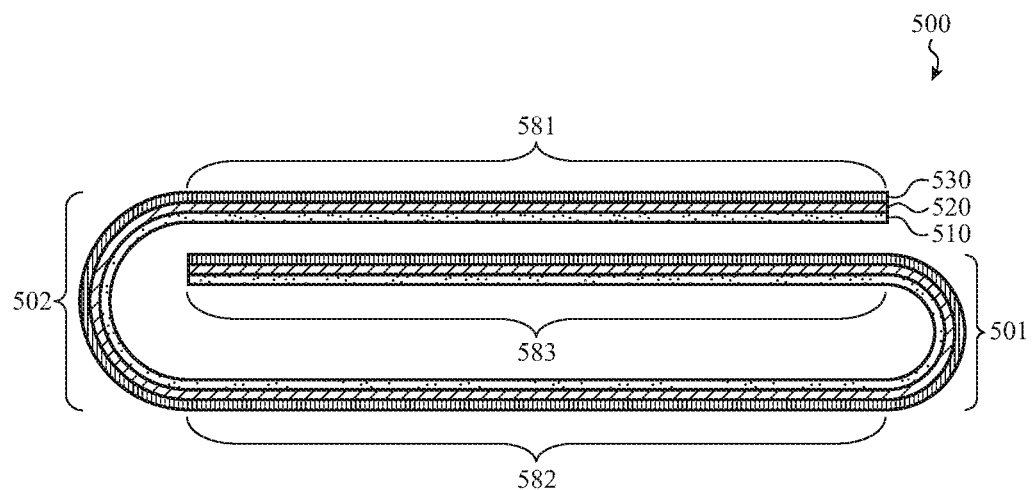
FIGS. 5A, 5B, and 5C respectively show cross-sectional views of another device in folded, partially unfolded, and unfolded configurations.
Figure 5B:
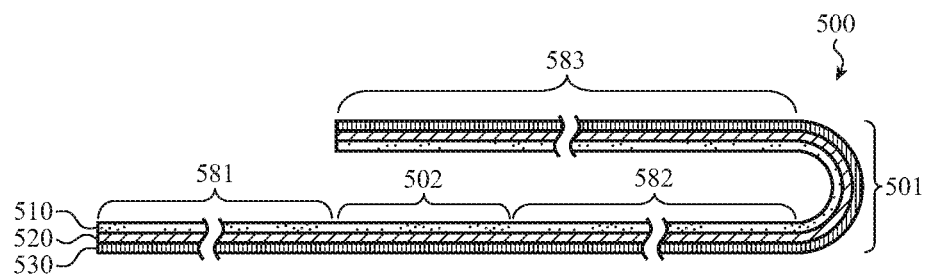
Figure 5C:
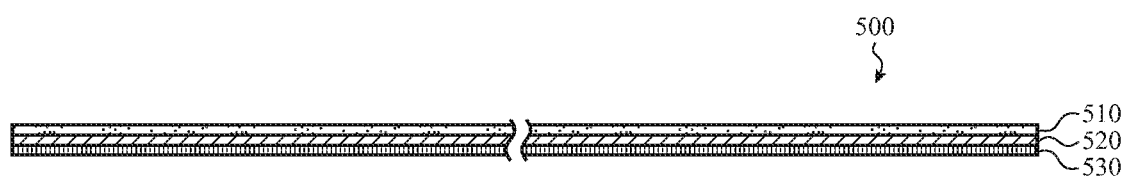

FIGS. 5A-5C show cross-sectional views of another device having two opposing bends which face each other in the fully folded configuration. As shown in FIGS. 5A-5C, the device 500 includes a cover layer 510, a display layer 520, and a backing layer 530. Similar to the previous example, the cover layer 510 may include one or more translucent or transparent ceramic layers that define an exterior surface of the device 500.

FIG. 5A depicts the device in a fully folded or closed configuration. In the fully folded or closed configuration, the display layer 520 is not viewable as the cover layer 510 is on the interior of the device. The cover layer and display layer are therefore protected from abrasion in this configuration.

As shown in FIG. 5A, the first foldable region 501 has a smaller bend radius than the second foldable region 502, which allows first region 581 to overlap third region 583. The third region 583 overlaps the second region 582. The first foldable region 501 is configured to bend in an opposite direction than the second foldable region 502.

FIG. 5B illustrates a partially unfolded (or partially folded) configuration of the device 500. The partially unfolded configuration may be formed after the first region 581 is rotated to straighten or unfold second foldable region 502. As shown in FIG. 5B, roughly one-third of the display layer 520 is visible along first region 581 and first foldable region 501.

FIG. 5C illustrates an unfolded configuration after the third region 583 is rotated as indicated. After the device 500 is fully unfolded as shown in FIG. 5C, the display layer 520 is now viewable along a single side of the device; as shown, this is the front side. As previously mentioned, while the device 500 is depicted as being flat in the unfolded state or configuration, it is not necessary that the device 500 have a perfectly flat or planar shape in the fully unfolded configuration. As previously discussed for devices 200-400, device 500 may be configured to operate in different modes for each configuration shown in FIGS. 5A-5B.

In general, a folding or bending of a flat component will result in a change in the stress state for at least a portion of the flat component at temperatures where the folding/bending stress is not relieved quickly. A flat component that is initially unstressed in a flat state will, when bent or folded, induce tensile stresses along an outer portion of the bend or fold and compressive stresses along an inner portion of the bend or fold. In general, the tensile or compressive stress induced by bending or folding a flat component depends on various factors including the bend angle or amount of bending that is induced at the fold. The tensile or compressive stress also depends on the thickness of the component and the bend radius of curvature. For a given component, the maximum tensile stress will increase as the thickness of the component increases, as the bend radius decreases, and/or as the bend angle is increased. In general, it may be desirable to keep the tensile stress below a particular threshold level, which may drive or limit the amount of bending or the bend angle of the component. The threshold stress level may also determine or limit the thickness and/or the bend radius of the component. The techniques described below with respect to FIGS. 6-12 and 14A-21B may be used to create components having an increased thickness, a decreased bend radius, and/or a larger bend angle than may be achieved using some traditional techniques.

In some embodiments, a sheet component for an electronic device is pre-shaped prior to incorporation in an electronic device to facilitate the formation of a foldable or bendable region within the sheet component. An example pre-shaping process includes preforming the sheet component to a preliminary shape including a bend region and annealing the sheet component. The pre-shaping process may further include a chemical strengthening step. In some embodiments, the shape of the pre-shaped sheet component is influenced by each of the steps in the pre-shaping process. In additional embodiments, the preforming step has the most influence on the shape of the pre-shaped sheet component. The sheet component may be used to form or may include a cover layer of an electronic device.

Pre-shaping of the sheet component as described herein can significantly reduce the level of tensile and compressive stresses induced by bending the sheet component to the folded or closed configuration of the device. For example, when a bend region in the pre-shaped sheet component is at least partially incorporated into a bend in the folded or closed configuration of the device, the stress state of the bend in the pre-shaped sheet component can affect the stress state of the bend in the folded or closed configuration of the device. In some cases, the preformed and annealed sheet component is referred to as having zero or substantially zero stress. However, it is not necessary that the pre-shaped sheet component have zero residual stresses and may, in fact, be chemically strengthened to produce an outer layer that is in a compressive state or retain some stress due to thermal processing. In embodiments, the amount of tensile and/or compressive stress in the preformed and annealed sheet component is less than a corresponding tensile and/or compressive stress when the sheet component is in either a folded or unfolded configuration.

In general, a preformed sheet component having a preliminary shape may include a localized bend geometry that is configured to limit the tensile stresses in the sheet component when the electronic device is in, for example, a folded or closed configuration. In general, the tensile stresses in the sheet component in the folded or closed configuration may be less than those that would be present in a similar layer in the folded or closed configuration which had not been preformed and annealed. For a given sheet component thickness, use of a preformed sheet component can allow a smaller radius of curvature or bend width to be obtained without exceeding a threshold or safe stress level. Similarly, for a given radius of curvature or bend width, a thicker sheet component can be used. In addition, preforming of the sheet component can reduce the amount of "springback" force when the sheet component is in a folded closed configuration.

In embodiments, the preliminary shape is different from the shape assumed in either the open (unfolded) or the closed (folded) configurations of the sheet component. For example, the radius of curvature, bend angle and/or the bend width of the preliminary shape may be different from that of the sheet component in either the folded or unfolded configuration. In some implementations, the preliminary shape may be configured so that the sheet component is biased towards either the open (unfolded) or the closed (folded) configuration.

For purposes of the following discussion, a preforming set of operations is performed on a sheet component. The sheet component may be a cover layer, a ceramic layer, a substrate and/or laminate having multiple layers of the same or different materials. For example, the sheet component may include one or more ceramic (e.g., glass) layers and may include one or more coatings, cladding layers, fillers, and/or materials. The sheet component may also include one or more translucent or transparent layers or materials. For ease of reference, the term "sheet component" is used to generically refer to any of these configurations.

In some embodiments, the sheet component is preformed to a preliminary shape intermediate between the shapes of the layer in the open and closed configurations of the device. For example, the sheet component may be preformed to a shape including a bend having a radius of curvature greater than or equal to that in the closed configuration and/or having a bend angle less than that in the closed configuration. In embodiments, a minimum radius of curvature of the preliminary shape may be up to two times greater or up to four times greater than that of the sheet component in the closed configuration. In embodiments, a bend angle of the preliminary shape may be from 90 degrees to less than 180 degrees, from 45 degrees to 135 degrees or from 90 degrees to 135 degrees.

FIG. 6A illustrates an example shape of a preformed sheet component (a cover layer, ceramic layer or a substrate) having a radius of curvature greater than that of the cover shape in the closed configuration. In this example, the sheet component 602 is formed into a preliminary shape (as shown) and then annealed to relieve stresses due to the forming operation. As stated previously, the sheet component 602 may have significantly reduced or near zero stress after being annealed. In addition, the sheet component may be cooled gradually enough from the annealing temperature so as not to induce additional thermal stresses. For example, inorganic glass sheet components may be cooled gradually to the strain point to limit thermal stresses.

In some cases, the sheet component 602 is chemically strengthened subsequent to annealing to induce compressive stress along the outer portions of the sheet component 602. When at least a portion of the foldable region has been chemically strengthened, the combination of the stresses due to chemical strengthening and the stresses generated on folding of the foldable region can determine the stress state of the glass in the foldable region. For example, the outer portion can have a compressive stress in the intermediate preformed configuration that is less than a compressive stress in the fully open configuration and greater than a compressive stress in the fully closed configuration. Various chemical strengthening embodiments are described below in more detail with respect to FIGS. 9A-9C and 22-25.

Figure 6C:
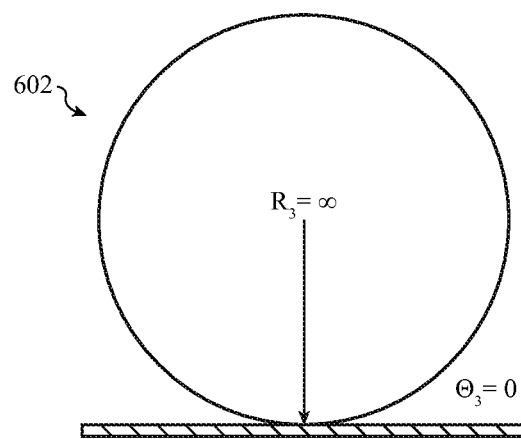
FIG. 6C shows the sheet component of FIG. 6A in an unfolded position.

The preformed geometry of the sheet component 602 of FIG. 6A may correspond to an intermediate configuration between the folded configuration of FIG. 6B and the unfolded configuration of FIG. 6C. As shown in FIG. 6A, the sheet component 602 is preformed to have bend portion 651 with a radius of curvature $R_1$ and bend angle $\theta_1$. FIG. 6B shows the sheet component 602 as folded in the closed configuration and having a bend region 652 with a radius of curvature $R_2$ and bend angle $\theta_2$ of 180 degrees. The bend regions adjoin regions 681 and 682. FIG. 6C shows the sheet component 602 as unfolded in the open configuration and having an effective infinite radius of curvature $R_3$ and bend angle $\theta_3$ of 0 degrees. In this example, the bend angle $\theta_2$ is greater than $\theta_1$. More specifically, the bend angle $\theta_1$ is approximately halfway between $\theta_2$ and $\theta_3$. If $\theta_3$ is approximately 0 degrees and $\theta_2$ is approximately 180 degrees, then $\theta_1$ may be approximately 90 degrees. In other embodiments, $\theta_1$ may be biased closer to $\theta_2$ or $\theta_3$ depending on whether it is desirable for the folded or the unfolded state, respectively, to have a lower overall stress condition.

The shape and curvature of the sheet component 602 may also vary between the preformed and folded configuration. In this example, $R_2$ is less than $R_1$. However, in some implementations $R_2$ may be approximately equal to $R_1$. For example, the ratio of $R_2/R_1$ may vary from 0.25 to 1. In some cases, the ratio of $R_2/R_1$ may vary from 0.5 to 1. While the radius is depicted as being a constant or single radius, the shape of the bend may vary in accordance with some embodiments.

As mentioned previously, an annealing or heating operation may be performed on the preformed sheet component to reduce or eliminate bending induced stress and/or residual stress. When a flat sheet component is bent to the shape of FIG. 6A using, for example, a forming process above the glass transition temperature but below the softening point, tensile and compressive stresses are induced in the sheet component by the bending process. In particular, tensile stresses may be induced on the outside of the bend and compressive stresses may be induced on the inside of the bend. The annealing step of the preforming process at least partially relaxes these stresses induced by the preforming bending operation. As another example, annealing reduces stresses acquired during cooling. In particular, by annealing after bending into the preformed shape of FIG. 6B, the tensile stresses along an outer region of the bend region are significantly reduced as compared to a pre-annealed preformed sheet component. If the tensile and compressive stresses are sufficiently reduced in the annealing process, the preliminary shape can have substantially no tensile or compressive stresses through the bend region.

After annealing, folding or bending the sheet component into either the folded configuration of FIG. 6B or the unfolded configuration of FIG. 6C will induce compressive and/or tensile stress into the sheet component. Thus, the preformed configuration of FIG. 6A can correspond to a minimum stress condition for the sheet component. As mentioned previously, a surface compressive stress may be produced along the surface of the sheet component using a chemical strengthening process.

Figure 7A:
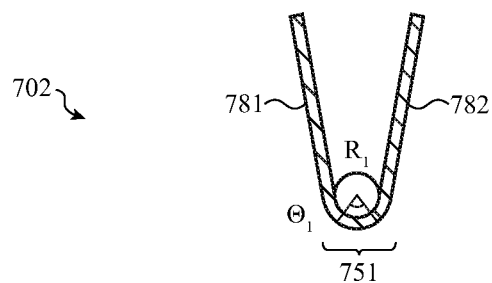
FIG. 7A illustrates a side view of another sheet component preformed to another preliminary shape and annealed.
Figure 7B:
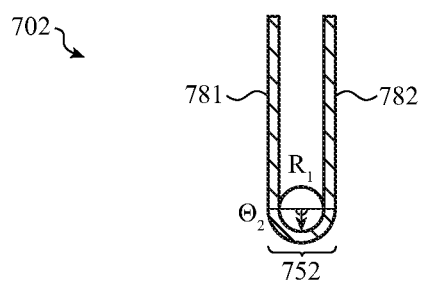
FIG. 7B shows the sheet component of FIG. 7A in a folded position.
Figure 7C:
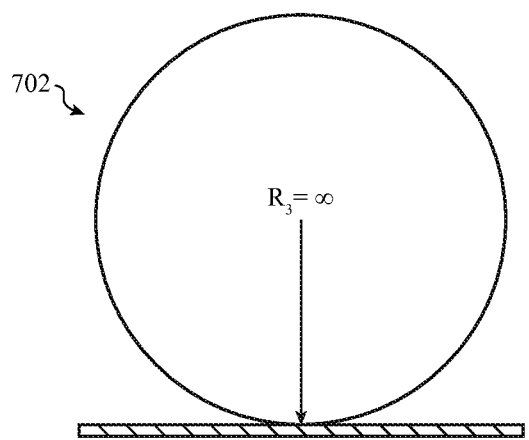
FIG. 7C shows the sheet component of FIG. 7A in an unfolded position.

FIGS. 7A-7C depict a similar process as described above with respect to FIGS. 6A-6C with a different preformed geometry. FIG. 7B shows the sheet component in a folded or closed configuration; the sheet component in this shape has a bend region 752 with a radius of curvature $R_1$ and bend angle $\theta_2$ of 180°. The bend region 752 adjoins regions 781 and 782. As shown, bend angle $\theta_2$ is greater than $\theta_1$. FIG. 7C shows the sheet component in an unfolded or open configuration, having an effective infinite radius of curvature $R_3$. Similar to the previous example, the sheet component of FIG. 7A may be annealed after forming to reduce or eliminate stress through the bend region 752.

FIG. 7A depicts a side view of an example shape of a preformed sheet component 702 having a radius of curvature equal to that of the cover shape in the closed configuration.

This preformed shape may result in less tensile stress in the closed configuration as compared to the preformed shape of FIG. 6A. In some cases, the preformed shape of FIG. 7A may bias the sheet component towards the folded or closed configuration of FIG. 7B. In FIG. 7A, the preformed sheet component has bend portion 751 with a radius of curvature $R_1$ and bend angle $\theta_1$. The bending angle in FIG. 7A is smaller than that of FIG. 6A. The smaller bend angle of the preformed shape of FIG. 7A may also tend to reduce the stress in the folded or closed configuration of FIG. 7B and may also bias the sheet component toward the folded configuration. Conversely, using the preformed shape of FIG. 7A, the stress may be increased for the unfolded or open configuration of FIG. 7C, as compared to the unfolded or open configuration of FIG. 6C when using the preformed shape of FIG. 7A.

Figure 8A:
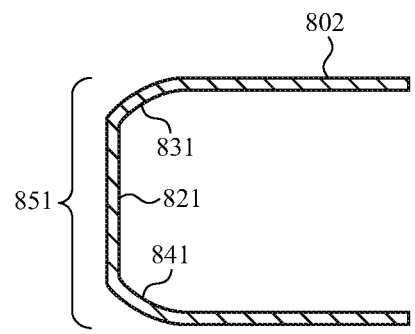
FIGS. 8A, 8B, and 8C illustrate alternate bend shapes for a preformed sheet component.
Figure 8B:
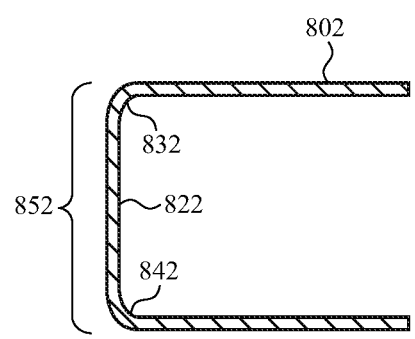
Figure 8C:
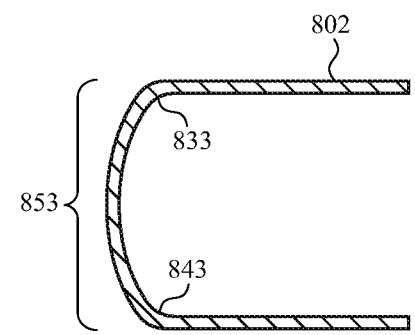

As shown in FIGS. 6A and 7A, the bend portion of the preformed sheet component has a substantially uniform radius of curvature. However, the bend portion of the preformed sheet component may also be formed to other shapes, as illustrated in FIGS. 8A, 8B and 8C. FIG. 8A illustrates a bend portion 851 of sheet 802 having a central flat region 821 with curved corners 831, 841. FIG. 8B illustrates a bend portion 852 having a central flat region 822 with curved corners 832, 842; the transition between the central flat region and the corners is more gradual than in FIG. 8A. FIG. 8C illustrates a bend portion 853 with a smaller radius of curvature at the upper portion, including upper corner 833 and a larger radius of curvature at the lower portion, including lower corner 843. These shapes are provided by way of example and are not intended to be limiting in nature.

Several methods can be used to form the sheet component into the preliminary or preformed shape and anneal it to reduce or eliminate bending induced stresses. In some embodiments, the forming process is a hot forming process in which the sheet component is heated to its softening point and then bent to the desired shape. In an example, the sheet component is cooled back down to ambient temperature at a slow enough rate so that no or virtually no residual stresses are left in the material.

Figure 9A:
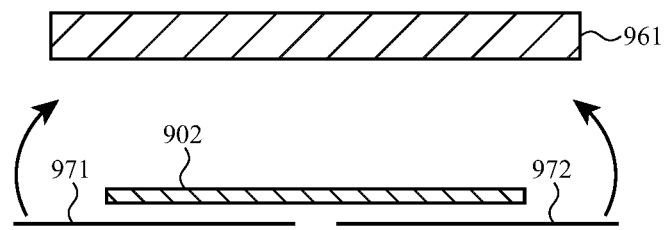
FIGS. 9A, 9B, and 9C illustrate formation of a bend in a sheet component using a pair of plates; the sheet component is shown from the side.
Figure 9B:
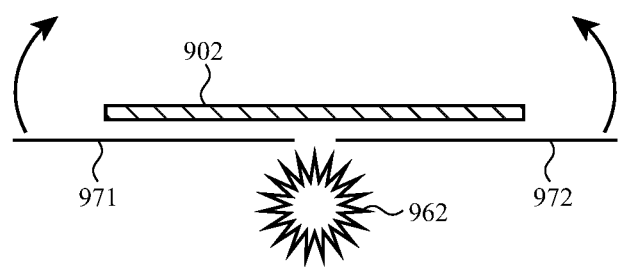
Figure 9C:
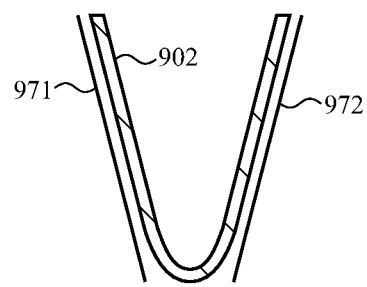

As an example, a pair of plates is used to introduce a bend into the sheet as shown in FIGS. 9A-9C. The sheet component 902 may be generally heated by a heat source 961 as shown in FIG. 9A or locally heated by source 962 as shown in FIG. 9B. When the plates 971 and 972 are moved as indicated by the arrows, the preformed shape shown in FIG. 9C is obtained.

Figure 10A:
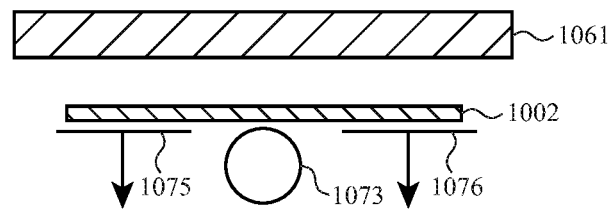
FIGS. 10A, 10B, 10C, and 10D illustrate formation of a bend in a sheet component using a mandrel; the sheet component is shown from the side.
Figure 10B:
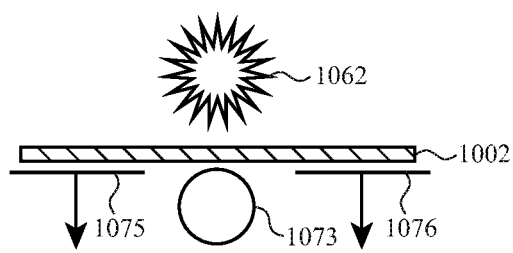
Figure 10C:
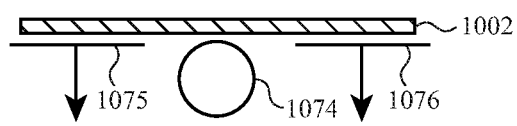
Figure 10D:
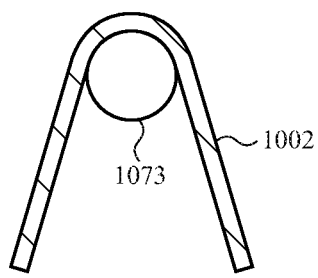

In another example, a mandrel is used to introduce a bend into the sheet component. As shown in FIGS. 10A-10C, the sheet component 1002 is supported on plates 1075 and 1076 that are moved downwards during the forming process, allowing the sheet component to slump over the mandrel 1073 or 1074. A variety of heat sources can be used, including a general heat source 1061 or a local heat source 1062 as shown in FIGS. 10A-10B or a heated mandrel 1074 as shown in FIG. 10C. FIG. 10D illustrates the shaped sheet component 1002 slumped or draped over the mandrel 1073. If desired, the sheet component can be shaped to a tighter bend while the sheet component is draped over the mandrel 1073. For example, another pair of plates (not shown) can be used to move the non-bend portions of the sheet component towards each other.

Figure 11A:
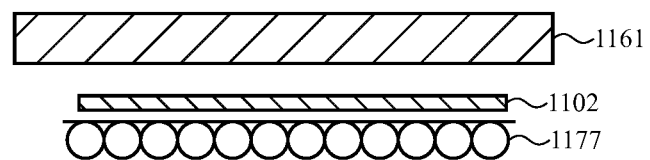
FIGS. 11A and 11B illustrate formation of a bend in a sheet component using adjustable rollers; the sheet component is shown from the side.
Figure 11B:
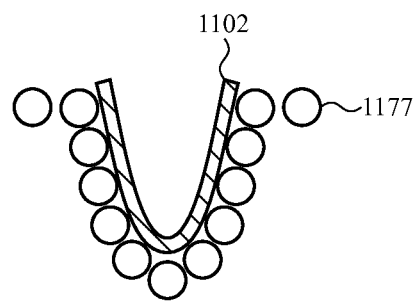

In a further example, rollers are used to introduce a bend into the sheet component. As shown in FIG. 11A, the sheet component 1102 is placed on a bed of rollers 1177 and generally heated with a heat source 1161. The position of the rollers is then adjusted to bring the sheet component to the desired shape as shown in FIG. 11B.

In some embodiments, at least a portion of the preformed sheet component is strengthened to introduce a compressive stress layer in the sheet after annealing. For example, the sheet component may be strengthened in its preformed or preliminary shape. When the preliminary shape is annealed to be essentially stress-free, such strengthening can produce compressive stresses on the outside of the bend in the preliminary shape. The tensile stresses induced on the outside of the bend by bending the sheet component to the closed configuration are thus reduced by such strengthening. In embodiments, the compressive stresses due to chemical strengthening are greater than the tensile stresses induced by bending from the preliminary shape to the closed configuration. In addition, strengthening to produce compressive stresses on the inside of the bend in the preliminary shape can reduce the tensile stresses induced on the inside of the bend by bending the sheet component to the open configuration.

Figure 12A:
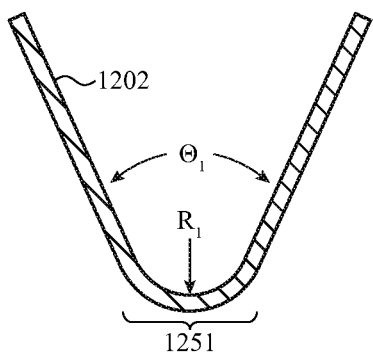
FIG. 12A illustrates a preliminary shape of a sheet component.
Figure 12B:
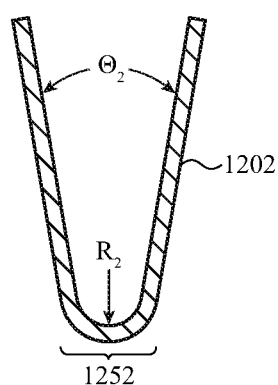
FIG. 12B illustrates an adjustment of the shape of FIG. 12A to a tighter bend radius before strengthening.
Figure 12C:
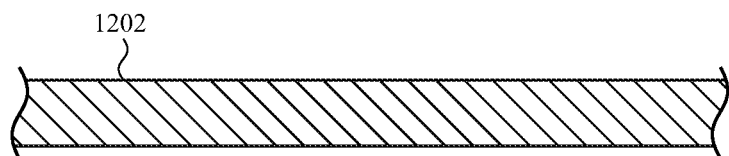
FIG. 12C illustrates an unfolded configuration of the sheet component of FIGS. 12A and 12B.

In another example, the cover glass in its preformed or preliminary shape is adjusted to a tighter bend prior to strengthening to introduce a compressive stress layer. Chemical strengthening can be enhanced on the outside of the bend due to the tensile stresses induced by the shape adjustment. FIG. 12A illustrates a preliminary shape of sheet component 1202 as formed with bend 1251 of bend radius $R_1$, a bend angle $\theta_1$ and annealed. FIG. 12B illustrates adjustment of the shape of FIG. 12A to form bend 1252 with a tighter bend angle $\theta_2$ before strengthening. In some instances, the bend radius $R_2$ may also be different than the bend radius $R_1$.

In general, chemically strengthening introduces a compressive stress layer to improve the strength and impact resistance of the sheet component 1202. By chemically strengthening the sheet component 1202 in an adjusted or further folded position as depicted in FIG. 12B, the combined effect of chemical strengthening and bending can produce compressive stressing the outer portion of the bend region, further enhancing the impact resistance and strength of the sheet component 1202 when in the folded or closed state. Furthermore, by chemically strengthening the sheet component 1202 in the adjusted or further folded position of FIG. 12B, the compressive stresses of the outer (or lower) portion of the sheet component 1202 in the unfolded or open configuration of FIG. 12C may also be further enhanced. However, when the inner portion of the foldable region is chemically strengthened to a lesser extent that the outer portion, the reduction in the tensile stresses in the corresponding inner (or upper) portion of the sheet component 1202 in the unfolded or open configuration may be reduced or eliminated. This may be an acceptable tradeoff if, for example, the inner (or upper) portion of the sheet component 1202 is facing inward toward the device and may be otherwise protected from impact.

In an alternative embodiment, the sheet component 1202 may be chemically strengthened when in the intermediate state or configuration of FIG. 12A. In one example, the sheet component 1202 may be annealed to be in a minimum or reduced stress condition at the intermediate state or configuration of FIG. 12A. The sheet component 1202 may then be chemically strengthened while in this intermediate state or configuration.

Figure 13:
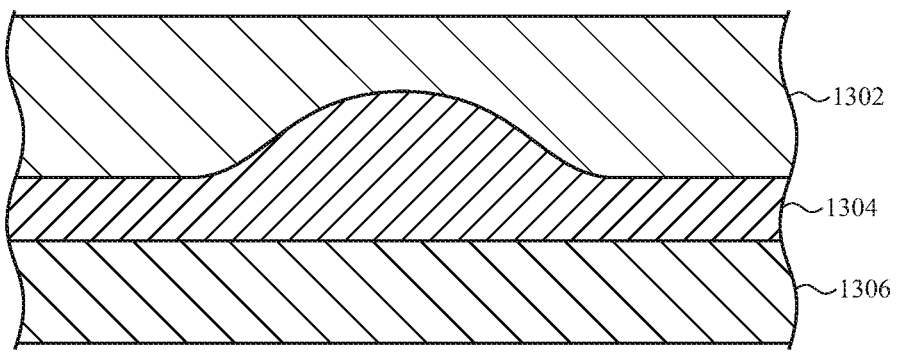
FIG. 13 illustrates an example cross-sectional view of a cover sheet coupled to a display layer using a cladding layer.

FIG. 13 depicts an example cross-sectional view of a cover sheet 1302 coupled to a display layer 1306 using cladding layer 1304. In some implementations, a preforming process using a mandrel or other tool may result in a surface artifact in the cover sheet 1302 (e.g., a localized depression). The cladding layer 1304 can be used to fill the structural artifact and camouflage or reduce the visual perceptibility of the surface artifact in the final product. In addition, the cladding layer 1304 can be used to fill other surface irregularities and may have an optical index that is between an optical index of the cover sheet 1302 and an optical index of a transparent substrate of the display layer 1306.

As shown in FIG. 13, the cover sheet 1302 includes a depression or recess that may be due to a localized thinning of the cover sheet 1302 caused when heating and preforming the cover sheet 1302. The cover sheet 1302 is positioned with the surface having the depression or recess facing the display layer 1306. The cover layer 1302 also defines a flat or uniform surface along an exterior surface of the device. As shown in FIG. 13, the cladding layer 1304 may fill the depression or recess, reducing or eliminating any visual impact. Attaching the cover sheet 1302 with the depression or recess faced towards the display layer 1306 may result in a smooth outer surface, which may enhance the appearance of the device.

With regard to FIG. 13, the cladding layer 1304 may be formed from an optically clear adhesive (OCA) or other type of bonding agent. In some cases, the cladding layer 1304 is formed from a glass material having a melting temperature that is lower than the melting temperature of the cover sheet 1302 and the display layer 1306. The cladding layer 1304, when melted or otherwise in a flowing state, fills the surface artifact while also forming a bond between the cover sheet 1302 and the display layer 1306.

In some implementations, features are formed into the substrate or glass of the cover sheet to facilitate bending at a particular location. The features may reduce the internal stress in the substrate or glass and may also help the cover sheet bend in a predictable and repeatable manner. The features may include an array of cuts or reliefs having a shape that is configured to facilitate a particular bend or living hinge. The cuts or reliefs that are formed into the cover sheet may be filled with a more flexible or pliable material that is optically index matched to the substrate or glass of the cover sheet. When the feature includes an array of relief features, each filler may be one of a set of fillers, each filler of the set of fillers being disposed in a relief feature of the array. In some embodiments, a relief feature may be characterized by one or more dimensions such as a width or a depth.

FIGS. 14A-19B depict different example embodiments of relief features formed into a substrate and filled with a flexible or pliable material. With respect to the following examples, a cover sheet may be formed from a translucent or transparent ceramic substrate and define one or more relief features. The relief features of the substrate may be partially or completely filled with a filler or filler material. The substrate may be formed from a glass sheet or other type of translucent or transparent ceramic material. While this is provided as merely an example, the substrate may be formed from other optically translucent materials including, for example, sapphire, polymer, and/or laminated layers of multiple sheets.

Figure 14A:
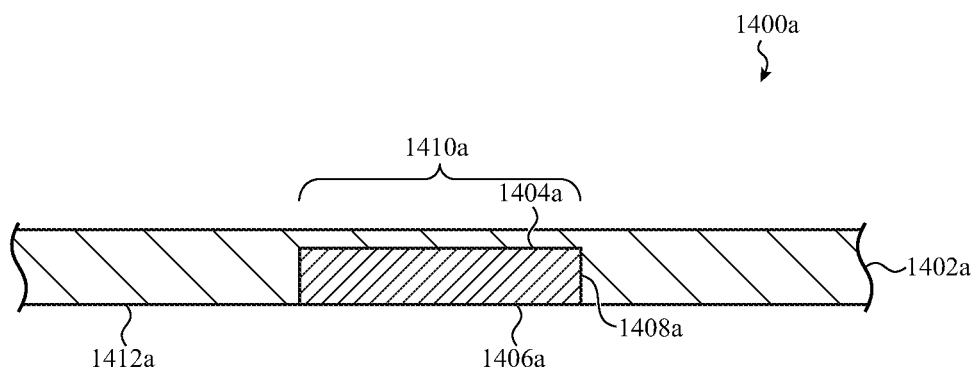
FIG. 14A illustrates an example cover sheet having a single relief feature.
Figure 14B:
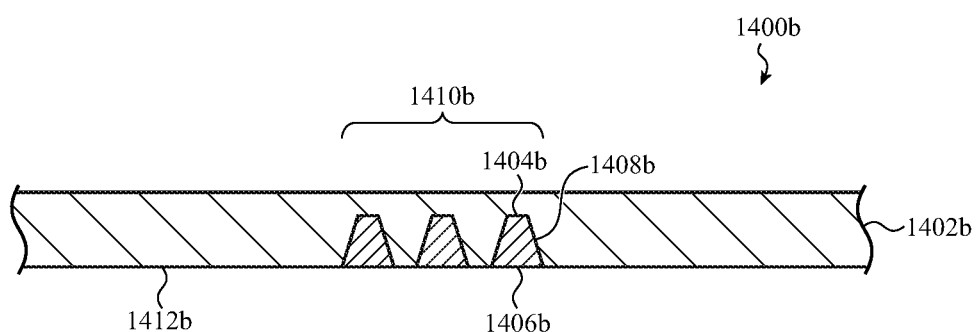
FIG. 14B illustrates an example cover sheet having multiple relief features.

FIGS. 14A-14B depict two example cover sheets having relief features. In FIG. 14A, the cover sheet 1400a includes a substrate 1402a having a single relief feature 1404a formed into a surface 1412a of the substrate 1402a. The relief feature 1404a reduces the thickness of the substrate 1402a over a bend region 1410a. The relief feature 1404a may also be referred to as a localized thinning of the substrate 1402a and serves to reduce the internal stress experienced by the substrate 1402a when the cover sheet 1400a is folded between flat and bent states. A relief feature generally includes a wall and may include a pair of opposing walls. As example, a wall can be substantially perpendicular to a surface or form an oblique angle with respect to the surface. FIG. 14A illustrates wall 1408a substantially perpendicular to surface 1412a.

As shown in FIG. 14A, the relief feature 1404a is filled with filler 1406a. The filler 1406a may include a flexible, pliable, or otherwise non-rigid material that is able to deform as the cover sheet 1400a is folded along the bend region 1410a. In some implementations, the filler 1406a is a polymer, which may have an optical index substantially matched to the substrate 1402a. Polymers capable of adhering to the substrate include, but are not limited to, acrylic-based polymers and silicone-based polymers. As an example, the polymer is an optically clear adhesive.

FIG. 14B depicts another example cover sheet 1400b having multiple relief features 1404b formed into a surface to define a bend region 1410b. FIG. 14B illustrates wall 1408b forming an oblique angle with respect to surface 1412b. Similar to the example provided above with respect to FIG. 14A, the relief features 1404b are each filled with a filler 1406b. Also similar to the previous example, the filler 1406b may include a flexible, pliable, or otherwise non-rigid material that is optically index matched to the substrate 1402b. The relief features 1404b create multiple thinned portions, which may reduce the stress experienced by the substrate 1402b when bending.

One potential advantage to the configuration of FIG. 14B is that the multiple or array of relief features 1404b may result in a more consistent or uniform bend radius throughout the bend region 1410b when the cover sheet 1400b is folded. The array of relief features 1404b may also provide a more flat or uniform thickness when the cover sheet 1400b is flat or unfolded. As described in more detail below with respect to FIGS. 18A-20B, the size and shape of the relief features 1404b may vary to produce different bend configurations or bend shapes when the cover sheet 1400b is folded.

Figure 14C:
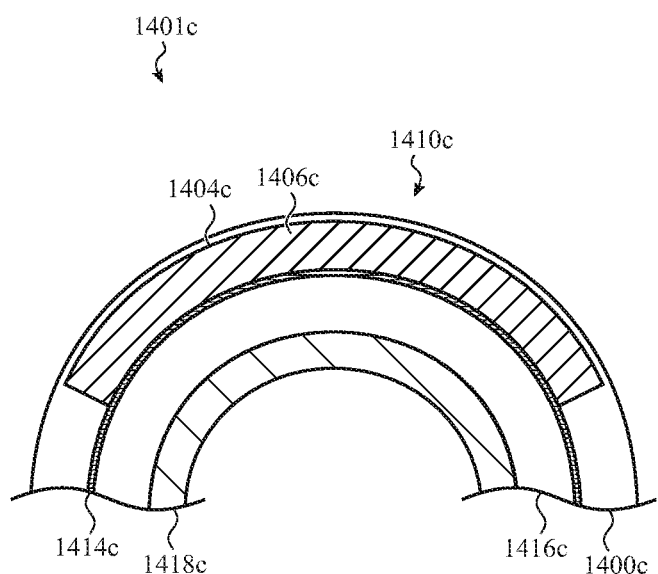
FIG. 14C illustrates an example electronic device in a folded portion, the electronic device including a cover sheet having a single relief feature and a flexible display layer.

FIG. 14C illustrates a folded configuration of an electronic device 1401c including a cover sheet 1400c similar to that of FIG. 14A. As shown in FIG. 14C, the cover sheet 1400c includes a substrate that may be formed from a ceramic material that defines an exterior surface of the electronic device over the bend or foldable region 1410c. By using a ceramic material along the foldable region 1410c, the device 1401c may have improved strength or durability when in the folded configuration. As shown, the display layer 1416c is sufficiently flexible to generally conform to the shape of the cover sheet in the folded configuration. Example flexible display layers are discussed in more detail with respect to FIG. 26. As shown in FIG. 14C, the device 1401c includes a cover sheet 1400c, optional adhesive 1414c, display layer 1416c, and backing layer 1418c. The foldable region 1410c, relief feature 1404c, and filler 1406c of the cover sheet are also shown. The adhesive 1414c couples or attaches the cover sheet 1400c to the display layer 1416c. The adhesive 1414c is shown as a continuous layer, but in other example configurations the adhesive may not form a continuous layer or may be absent. The backing layer 1418c is depicted as a single component in FIG. 14C for simplicity. However, the backing layer 1418c may include one or more other components of the electronic device 1401c, as described in more detail below with respect to FIG. 26. One or more of the components may be flexible or bendable and extend across the foldable region 1410c. The backing layer 1418c or other device components may be attached to the display layer 1416c with an adhesive in a similar manner as described for adhesive 1414c.

Figure 15A:
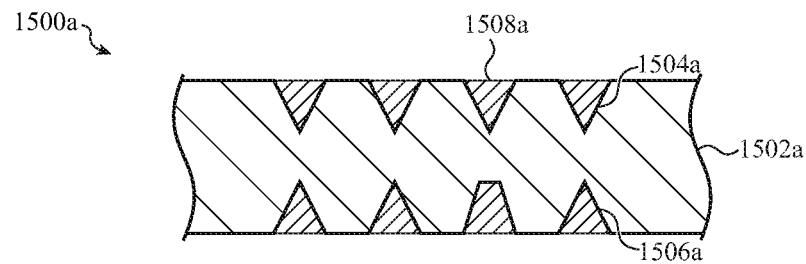
FIGS. 15A and 15B illustrate example cover sheets having an array of relief features formed on two sides of a substrate.
Figure 15B:
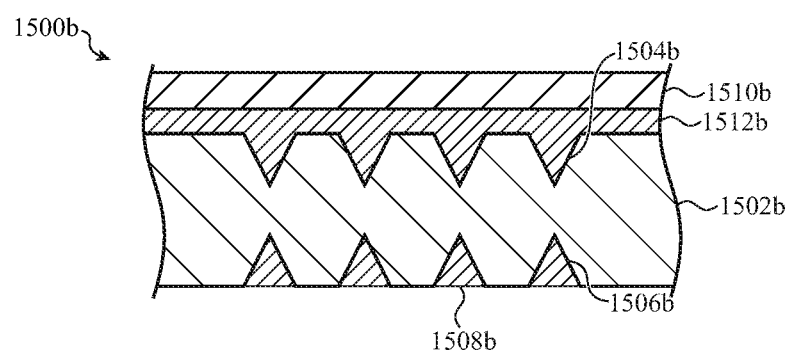

FIGS. 15A-15B depict example cover sheets having an array of relief features formed on each of two sides of a substrate. In particular, as shown in FIG. 15A, the cover sheet 1500a includes a substrate 1502a having a first array of relief features 1504a formed along a first surface and a second array of relief features 1506a formed along a second surface opposite to the first surface. Similar to the previous examples, the relief features 1504a and 1506a are filled with a filler 1508a. Similar to the previous examples, the filler 1508a may be formed from a flexible, pliable, or otherwise non-rigid material including but not limited to optically clear adhesives or polymer materials.

The cover sheet 1500a of FIG. 15A may provide several advantages. Specifically, the relief features 1504a and 1506a form a series of locally thinned regions. Similar to the previous examples, the locally thinned region may reduce the overall stress in the substrate 1502a when being folded or bent. Additionally, having relief features 1504a and 1506a formed on opposite sides of the substrate 1502a, the locally thinned portions of the substrate 1502a are located closer to the neutral axis of the cover sheet 1500a. Thus, the stress produced within the locally thinned regions may be further reduced or minimized. By having relief features 1504a and 1506a formed on opposite sides of the substrate 1502a, the cover sheet 1500a may be able to bend around a smaller radius without exceeding a threshold or safe stress level within the substrate 1502a.

FIG. 15B depicts another example cover sheet 1500b. Similar to the previous example, the substrate 1502b includes a first array of relief features 1504b formed on a first surface and a second array of relief features 1506b formed on a second, opposite side. Both arrays of relief features 1504b and 1506b are filled with a filler 1508b, similar to as described above with respect to FIG. 15A. In addition, the cover sheet 1500b also includes an outer cover layer 1510b positioned over the side of the substrate 1502b having the first array of relief features 1504b. The outer cover layer 1510b may be formed form a ceramic material and may define a smooth continuous surface along the foldable region of the device.

The outer cover layer 1510b may provide a uniform outer surface for the cover sheet 1500b. A more uniform or continuous outer surface may enhance the visual appearance of the cover sheet 1500b as well as providing a more uniform feel to the touch. In some cases, the outer cover layer 1510b provides enhanced scratch resistance for the cover sheet 1500b. The outer cover layer 1510b may be formed from chemically strengthened glass, sapphire, or other scratch-resistant material.

As shown in FIG. 15B, the outer cover layer 1510b may be attached or coupled to the substrate 1502b by an adhesive layer 1512b. In some implementations, the interface between the outer cover layer 1510b and the rest of the cover sheet 1500b may be configured to reduce the stress produced in the outer cover layer 1510b when the cover sheet 1500b is folded. For example, the adhesive layer 1512b may be configured to provide some compliance in shear to allow the outer cover layer 1510b to shift or slip with respect to the substrate 1502b when the cover sheet 1500b is folded and/or unfolded. The shear compliance may allow the outer cover layer 1510b to bend about a neutral axis that is located within or near the outer cover layer 1510b thereby reducing the stress produced in the outer cover layer 1510b. Alternatively, the adhesive layer 1512b may have a high resistance to shear and strongly couple the outer cover layer 1510b to the substrate 1502b. This may move the neutral axis of the outer cover layer 1510b to a region within the substrate 1502b, which may stiffen or strengthen the cover sheet 1500b.

Figure 16:
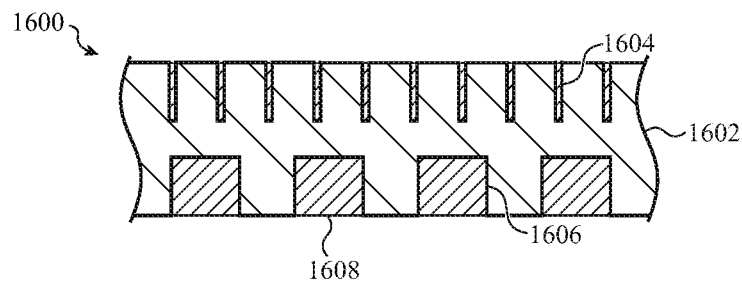
FIG. 16 illustrates an example cover sheet having two asymmetrical sets of relief features formed on two sides of a substrate.

FIG. 16 depicts an example cover sheet having two asymmetrical sets of relief features formed in opposite sides. Specifically, the cover sheet 1600 includes a first set of relief features 1604 formed on a first surface and each of the relief features in the first set having a width that is narrower as compared to each of the relief features in a second set of relief features 1606 formed on a second, opposite surface of the substrate 1602. Similar to the previous examples, the cover sheet 1600 includes a filler 1608, which may be formed from a flexible, pliable, or otherwise non-rigid material including but not limited to optically clear adhesives or polymer materials.

This configuration may provide a more consistent or uniform outer surface due to the narrower relief features 1604. In some cases, the narrower relief features 1604 are visually and/or tactilely imperceptible when the cover sheet 1600 is in a flat or unfolded configuration. In some cases, the asymmetric nature of the relief features enhances the flexibility for the cover sheet 1600 in a given bend direction. For example, the wider relief features 1606 formed on the second surface of the substrate 1602 may enhance the flexibility of the cover sheet 1600 when bent inwardly along the second surface.

Figure 17A:
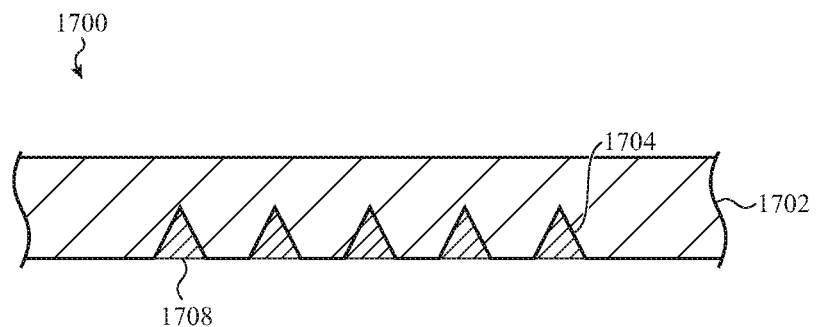
FIGS. 17A and 17B illustrate an unfolded and folded state of an example cover sheet having relief features.
Figure 17B:
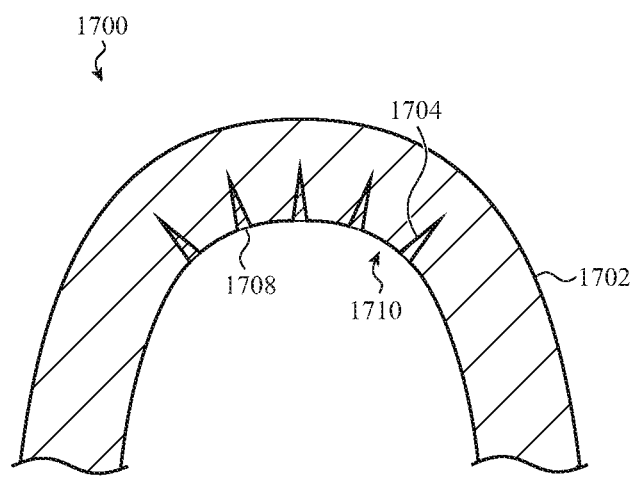

FIGS. 17A and 17B depict an unfolded and folded state of an example cover sheet having relief features that limit the bend radius of the cover sheet when the side having the relief features is on the inside of the bend. As shown in FIGS. 17A and 17B, the relief features are provided on one side or surface of the sheet. In other embodiments, such as when the cover sheet forms an S-shaped bend, relief features may be provided on both sides or opposing surfaces of the sheet. In general, the size and shape of the relief features may control the minimum bend radius of the cover sheet. As shown in FIGS. 17A and 17B, the cover sheet 1700 includes a substrate 1702 having relief features 1704 formed into a surface and filled with filler 1708. The filler 1708 may be a non-rigid material, similar to as described above with respect to other examples.

As shown in FIG. 17B, the minimum bend radius 1710 may be determined by the size and shape of the relief features 1704. Specifically, as the cover sheet 1700 is folded, the relief features 1704 begin to collapse and compress the filler 1708. The minimum bend radius 1710 may be determined by the amount of bending at which the filler 1708 reaches a maximum compression. In some cases, the minimum bend radius 1710 corresponds to the amount of bending in which the relief features 1704 can no longer collapse further. In general, the wider or larger the relief features 1704, the smaller or tighter the minimum bend radius 1710. Conversely, the narrower or smaller the relief features 1704, the larger the minimum bend radius 1710. A tapered or angled shape of the relief feature 1704, as shown in FIGS. 17A and 17B, may also determine the minimum bend radius 1710.

Figure 18A:
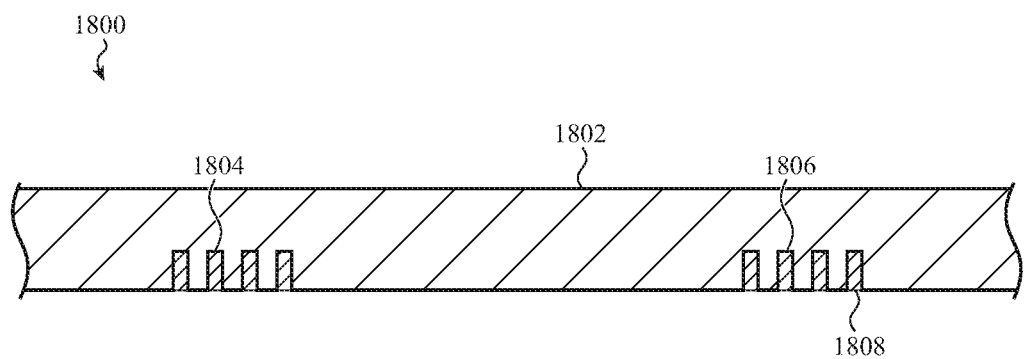
FIGS. 18A and 18B illustrate an unfolded and folded state of an example cover sheet having two sets of relief features.
Figure 18B:
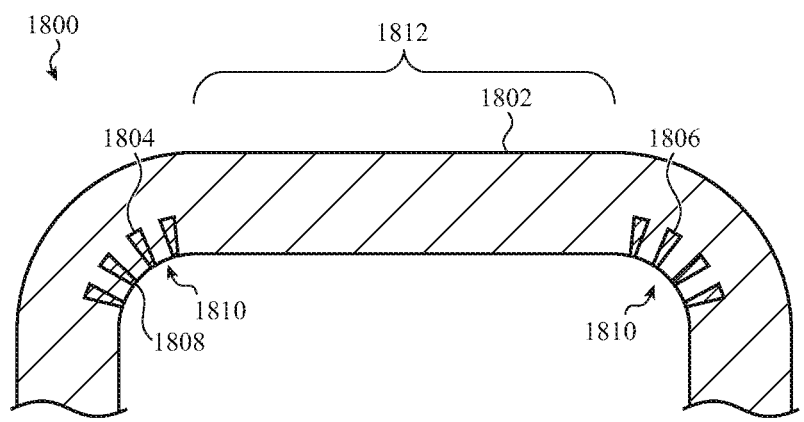

FIGS. 18A and 18B depict an unfolded and folded state of an example cover sheet having relief features that form a generally flattened edge along a bend in the cover sheet. As shown in FIGS. 18A and 18B, the relief features are provided on one side of the sheet. In other embodiments, such as when the cover sheet forms an S-shaped bend, relief features may be provided on both sides of the sheet. In general, relief features may be grouped or arranged along a surface of the substrate to provide a desired geometry, such as a flat or straight region within the bend. As shown in FIGS. 18A and 18B, the cover sheet 1800 includes a substrate 1802 having a first set of relief features 1804 and a second set of relief features 1806 formed into a surface and filled with filler 1808. The filler 1808 may be a non-rigid material, similar to as described above with respect to other examples.

As shown in FIGS. 18A and 18B, the first and second sets of relief features 1804 and 1806 result in two localized bends, each having a bend radius 1810. The two bends are separated by a flat region 1812, which may have a substantially flat or straight geometry. In this example, the flat region 1812 does not include any relief features, which may help maintain the flatness or straightness of the flat region 1812 as the cover sheet 1800 is folded. In some cases, the flat region 1812 includes a small amount of bowing and is not perfectly flat.

Figure 19A:
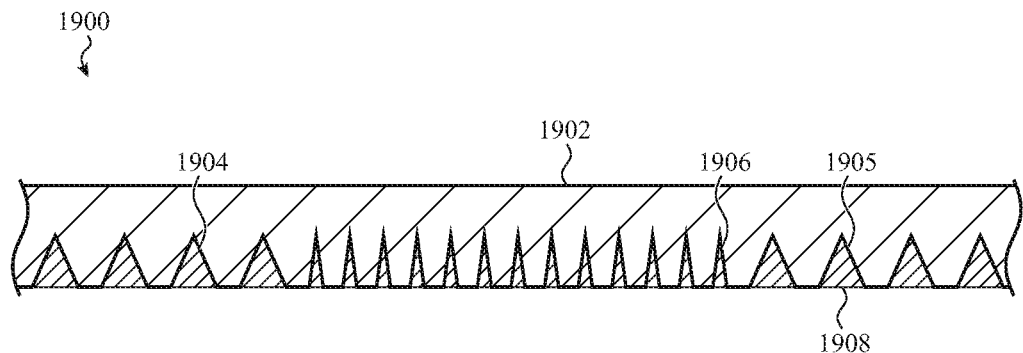
FIGS. 19A and 19B illustrate an unfolded and folded state of another example cover sheet having two sets of relief features.
Figure 19B:
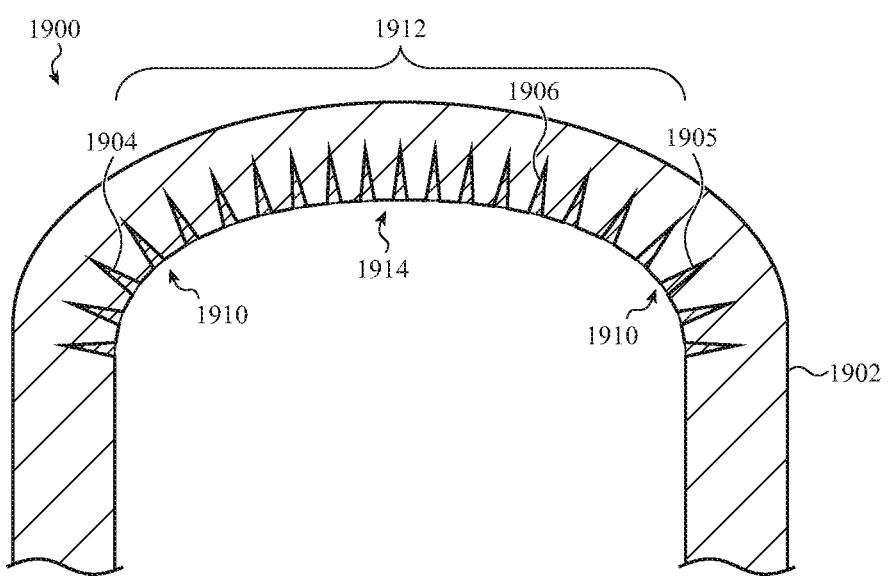

FIGS. 19A and 19B depict an unfolded and folded state of an example cover sheet having relief features that form an arced or bowed edge along a bend in the cover sheet. As shown in FIGS. 19A and 19B, the relief features are provided on one side of the sheet. In other embodiments, such as when the cover sheet forms an S-shaped bend, relief features may be provided on both sides of the sheet. In general, sets of differently sized relief features may be grouped or arranged along a surface of the substrate to provide a desired geometry, such as an arced or bowed region within the bend. As shown in FIGS. 19A and 19B, the cover sheet 1900 includes a substrate 1902 having a first set of relief features 1904, a second set of relief features 1905, and a third set of relief features 1906 formed between the first and second sets. The relief features may be filled with a filler 1908, which may be a non-rigid material, similar to as described above with respect to other examples.

As shown in FIGS. 19A and 19B, the first and second sets of relief features 1904 and 1906 result in two localized bends, each having a bend radius 1910. The two bends are separated by a bowed region 1912, which has an arc radius 1914 that is substantially larger than the bend radii 1910. In this example, the shape of the bowed region 1912 is due, in part, to the size and shape of the third set of relief features 1906. In general, the third set of relief features 1906 are smaller or narrower than the first and second sets of relief features 1904 and 1905 when the cover sheet is unfolded, which results in the larger arc radius 1914. FIGS. 19A and 19B are provided as an example, and the relief geometry, relief spacing, or other aspects of the relief arrangement may be varied to produce a similar result.

For each of the examples described above with respect to FIGS. 14A-19B, the relief cuts may be formed into the surface of the substrate using various machining operations or techniques. For example, the relief cuts may be formed using a laser ablation, chemical etching, grinding, or other similar material removal technique. Also, for each of the examples described above with respect to FIGS. 14A-19B, the respective bend regions may be preformed in accordance with the preforming embodiments described above with respect to FIGS. 6A-12B.

Figure 20A:
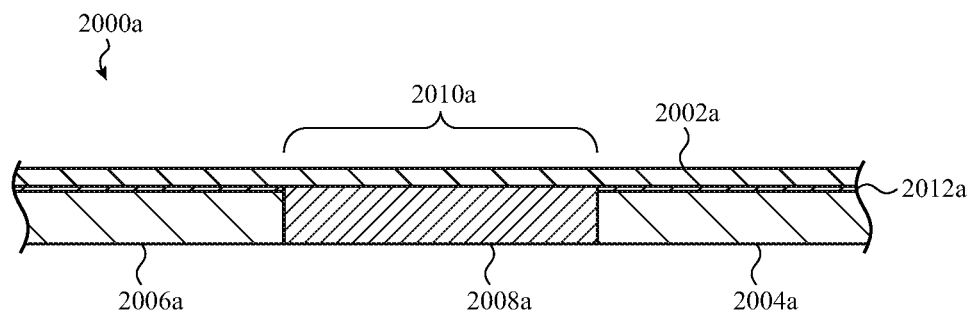
FIGS. 20A and 20B depict example cover sheets formed from a laminated stack of layers.
Figure 20B:
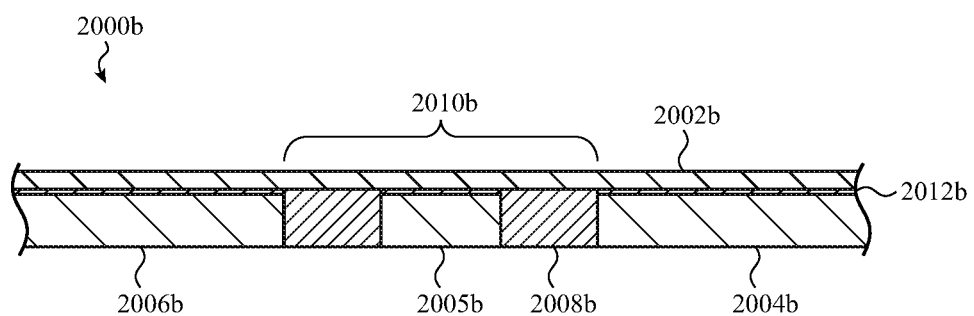

FIGS. 20A-20B depict example cover sheets formed from a laminated stack of layers. The laminated stack of layers may define one or more relief features or locally thinned regions that facilitate bending or folding the cover glass. In particular, FIG. 20A depicts cover sheet 2000a having a laminated stack of layers including an outer layer 2002a bonded to inner layers 2004a and 2006a by an interface layer 2012a. As shown in FIG. 20A, a recess or relief feature is formed between the layers and filled with filler 2008a. The relief features may be filled with filler 2008a, which may be a pliable or non-rigid material, similar to as described above with respect to other examples.

FIG. 20B depicts another configuration of a cover sheet 2000b having an outer layer 2002b bonded to multiple inner layers 2004b, 2005b, and 2006b by an interface layer 2012b. As shown in FIG. 20B, the multiple inner layers 2004b, 2005b, and 2006b define multiple recesses or relief features between each inner layer. Similar to as described above, the relief features may be filled with a filler 2008b, which may be a pliable or non-rigid material.

The laminated cover sheets 2000a and 2000b of FIGS. 20A and 20B having relief features may facilitate bending or folding in a manner similar to as described above with respect to FIGS. 14A-19B. In particular, having one or more locally thinned regions formed into the cover sheet may reduce the amount of stress produced within one or more of the substrates while the cover sheet is folded and/or unfolded. Similar to the previous examples, the recesses can be formed on opposing sides of the cover sheet and may vary in size and shape to provide a particular bend geometry or shape.

The laminated cover sheets 2000a and 2000b of FIGS. 20A and 20B may provide manufacturing advantages over other techniques. For example, the laminated cover sheets 2000a and 2000b may be formed using a glass lamination process that does not require a material removal operation to form the relief features. This may save time and simplify the manufacturing process. It may also provide some ability to rework and/or correct manufacturing defects because the relief features are not permanently formed into a particular article.

The laminated technique depicted in FIGS. 20A and 20B also allows different materials to be used to enhance the performance of the cover sheets 2000a and 2000b. For example, the outer layers 2002a and 2002b may be formed from a hard or scratch-resistant material, such as sapphire or strengthened glass. The inner layers 2004a, 2006a, 2004b, 2005b, and 2006b may be formed from a material having lower hardness or greater pliability as compared to the outer layers 2002a and 2002b. Accordingly, the material properties of each layer may be selected for a particular purpose to provide an enhanced composite cover sheet.

In some implementations, the interface layers 2012a and 2012b may be configured to provide a particular flexibility and/or stress profile within the cover sheets 2000a and 2000b. For example, an interface layer 2012a, 2012b having a high resistance to shear may produce a stiffer or more rigid cover sheet 2000a, 2000b. By not allowing the outer layer to slip or shift with respect to the inner layers, the cover sheet may have a higher overall bending moment, which enhances the strength and rigidity of the cover sheet. In some embodiments, the outer layers 2002a and 2002b are fused (without adhesive) to corresponding inner layers 2004a, 2006a, 2004b, 2005b, 2006b to form a joint that is highly resistant to shear. An interface layer 2012a, 2012b having a low resistance to shear may be used in order to allow relative slip between the layers and lower the overall stress in each of the layers. This may be helpful in configurations in which the outer layer is very thin and/or may have a reduced ability to withstand high internal stress.

When the outer layers and inner layers have a different index of refraction, the interface layers 2012a, 2012b may provide transition in index of refraction between the outer and inner layers to improve the transmissivity of the stack. For example, when the inner and outer layers have a different optical index of refraction, the interface may provide a transition in optical index of refraction. This may also reduce reflection or other visual artifacts created by the bond between outer and inner layers. In some instances, the interface layers 2012a, 2012b are doped or treated to produce an index gradient through the thickness of the interface layers 2012a, 2012b. For example, the interface layers 2012a, 2012b may be treated to have an index that gradually increases (or gradually decreases) across the depth of the interface layers 2012a, 2012b to match the corresponding optical indexes of the inner and outer layers. In one example implementation, the interface layers 2012a, 2012b include an aluminum particulate that is sputtered into a glass or other matrix. The concentration of the aluminum particulate may vary with the depth, thereby varying the optical index of the interface layers 2012a, 2012b.

Figure 20C:
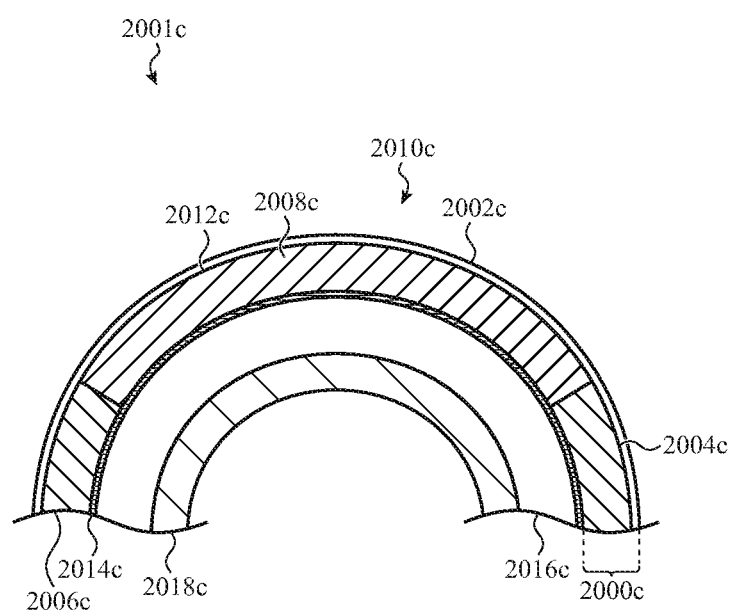
FIG. 20C illustrates an example electronic device in a folded portion, the electronic device including a laminate cover sheet and a flexible display layer.

FIG. 20C illustrates a folded configuration of an electronic device including a cover sheet 2000c similar to that of FIG. 20A. As shown in FIG. 20C, the cover sheet 2000c includes a substrate that may be formed from a ceramic material that defines an exterior surface of the electronic device over the bend or foldable region 2010c. By using a ceramic material along the foldable region 2010c, the device 2001c may have improved strength or durability when in the folded configuration. As shown, the display layer 2016c is sufficiently flexible to generally conform to the shape of the cover sheet in the folded configuration. Example flexible display layers are discussed in more detail with respect to FIG. 26. As shown in FIG. 20C, the device 2001c includes a cover sheet 2000c, optional adhesive 2014c, display layer 2016c, and backing layer 2018c. The bend region 2010c, outer layer 2002c, inner layers 2004c, 2006c, filler 2008c, and interface layer 2012c of the cover sheet are also shown. The adhesive 2014c couples or attaches the cover sheet 2000c to the display layer 2016c. The adhesive 2014c is shown as a continuous layer, but in other example configurations the adhesive may not form a continuous layer or may be absent. The backing layer 2018c is depicted as a single component in FIG. 20C for simplicity. However, the backing layer 2018c may include one or more components of the electronic device 2001c, as described in more detail below with respect to FIG. 26. One or more of the components may be flexible or bendable and extend across the foldable region 2010c. The backing layer 2018c or other device components may be attached to the display layer 2016c with an adhesive in a similar manner as described for adhesive 2014c.

Figure 21A:
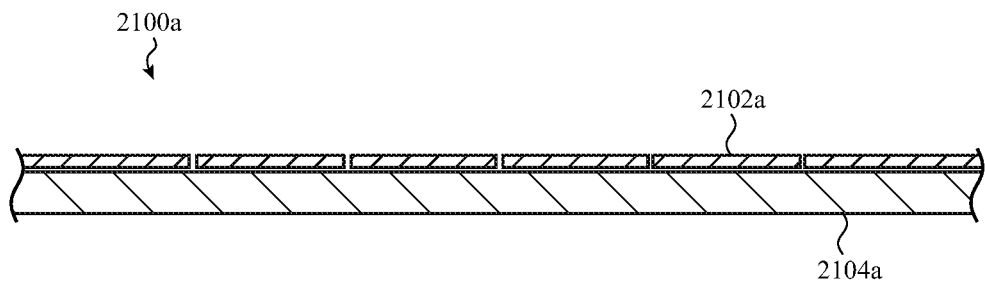
FIGS. 21A and 21B depict example cover sheets having multiple panels integrated with a flexible substrate.
Figure 21B:
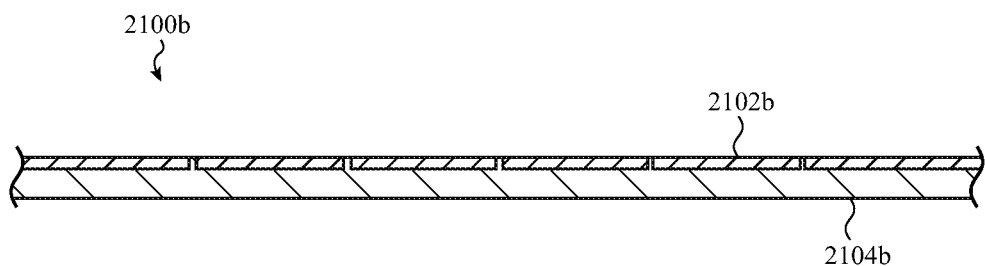

FIGS. 21A and 21B depict example cover sheets having multiple panels integrated with a flexible substrate. The multiple panels or sections may also facilitate bending or folding of the cover sheet. As shown in FIG. 21A, the cover sheet 2100a includes multiple panel layers or panels 2102a coupled to a base layer or substrate 2104a. In some implementations, each panel 2102a is formed from a relatively hard rigid material and the substrate 2104a is formed from a more pliable flexible material. In one example, each of the panels 2102a is formed from a glass or sapphire sheet and the substrate 2104a is formed from a polymer sheet. In some embodiments, the panels 2102a form the outer surface of the cover sheet 2100a. In some cases, the panels 2102a are covered on both sides with a protective layer or substrate.

As shown in FIG. 21A, the panels 2102a are arranged with small gaps or spaces between the panels to define locally thinned regions of the cover sheet 2100a. In some instances, the gaps or spaces may be filled with a filler, similar to as described above with respect to other embodiments. The locally thinned regions may allow the cover sheet 2100a to bend or fold in a manner similar to other examples provided above with respect to FIGS. 14A-20B.

Also similar to the previous examples, the size, shape, and spacing of the various gaps may determine or facilitate a particular bend or fold.

FIG. 21B depicts a cover sheet 2100b having multiple panel layers or panels 2102b that are pressed, embedded, or formed into the base layer or substrate 2104b. In this example, the panels 2102b are at least partially embedded into a surface of the substrate 2104b and the substrate 2104b is able to deform sufficiently to fill the gaps between the panels 2102b, eliminating the need for a filler or other material to occupy the space between the panels 2102b. Similar to the previous example, the gaps between the panels 2102b facilitate bending of the cover sheet 2100b and may be arranged or configured to produce a particular bend geometry or shape. Also similar to the previous example, the panels 2102b may be formed from a hard sheet, such as strengthened glass or sapphire and the substrate 2104b may be formed from a polymer.

Figure 21C:
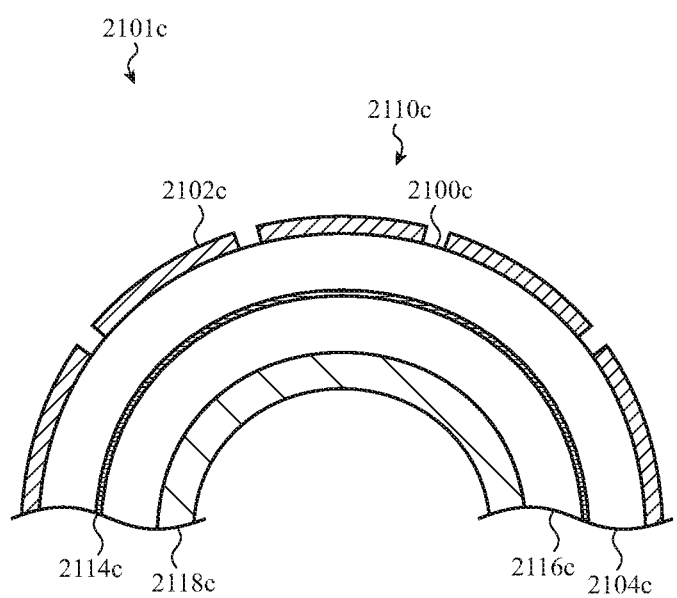
FIG. 21C illustrates an example electronic device in a folded portion, the electronic device including another laminate cover sheet and a flexible display layer.

FIG. 21C illustrates a folded configuration of an electronic device including a cover sheet 2100c similar to that of FIG. 21A. As shown in FIG. 21C, the cover sheet 2100c includes a substrate that may be formed from a ceramic material that defines an exterior surface of the electronic device over the bend or foldable region 2110c. By using a ceramic material along the foldable region 2110c, the device 2101c may have improved strength or durability when in the folded configuration. As shown, the display layer 2116c is sufficiently flexible to generally conform to the shape of the cover sheet in the folded configuration. Example flexible display layers are discussed in more detail with respect to FIG. 26. As shown in FIG. 21C, the device 2101c includes a cover sheet 2100c, optional adhesive 2114c, display layer 2116c, and backing layer 2118c. The bend region 2110c, panels 2102c, and substrate 2104c of the cover sheet are also shown. The adhesive 2114c couples or attaches the cover sheet 2100c to the display layer 2116c. The adhesive 2114c is shown as a continuous layer, but in other example configurations the adhesive may not form a continuous layer or may be absent. The backing layer 2118c is depicted as a single component in FIG. 21C for simplicity. However, the backing layer 2118c may include one or more components of the electronic device 2101c, as described in more detail below with respect to FIG. 26. One or more of the components may be flexible or bendable and extend across the foldable region 2110c. The backing layer 2118c or other device components may be attached to the display layer 2116c with an adhesive in a similar manner as described for adhesive 2114c.

In some embodiments, ceramic cover sheet layers or substrates as described herein are strengthened before being placed into the electronic device. In an example, an inorganic glass sheet component is chemically strengthened by an ion exchange process which induces compressive stress in a surface layer of the sheet component. Alternately, a field-assisted chemical strengthening process or an ion bombardment process is used to introduce ions into the cover sheet, thereby inducing compressive stress in the sheet component. The depth of the compressive stress layer and the peak compressive stress can be used as measures of the amount of strengthening. In some embodiments the peak compressive stress is at the surface of the cover glass while in other components the peak compressive stress may be located below the surface of the cover glass. The unstrengthened central portion of the sheet component typically experiences tensile stress when a compressive stress layer is formed; the central tension of the sheet can be used as a measure of the tensile stress.

Glass compositions suitable for ion exchange or field assisted chemical strengthening include, but are not limited to, alumina silicate glass (aluminosilicate glass), soda lime glass, borosilicate glass or lithium containing glass. For an ion exchange process conducted primarily at temperatures below the strain point of the glass, ions in the glass are exchanged with larger ions to set up compressive stresses in an outer layer of the glass. For example, the ion exchange process may involve the exchange of alkali metal ions, such as the exchange of sodium ions for potassium ions or the exchange of lithium ions for sodium ions. In an example, the chemical strengthening process involves exposing the glass to a medium containing the larger ion, such as by immersing the glass in a bath containing the larger ion or by spraying or coating the glass with a source of the ions. For example, a salt bath comprising the ion of interest (e.g., a potassium nitrate bath) may be used for ion exchange. Suitable temperatures for ion exchange are above room temperature and are selected depending on process requirements. In embodiments, the chemical strengthening process includes one or more ion exchange steps. A multi-step ion exchange chemical strengthening process may comprise a step of exchanging ions in the glass for larger ions, followed by a step of exchanging some of the larger ions introduced in the previous step for smaller ions.

Selective chemical strengthening of a sheet component can be achieved through masking techniques. For example, portions of the sheet component which are to be strengthened to a lesser depth are masked before the sheet component is exposed to the ion exchange medium. After chemical strengthening of the rest of the sheet component, the mask can be removed. If desired, additional chemical strengthening steps can be used to obtain the desired levels of chemical strengthening. Additional masking steps can also be used to obtain the desired chemical strengthening profile. Suitable masking materials include, but are not limited to, metals, polymers, and ceramics. In some embodiments, photolithographic patterning or etching are used to pattern the mask material.

Figure 22:
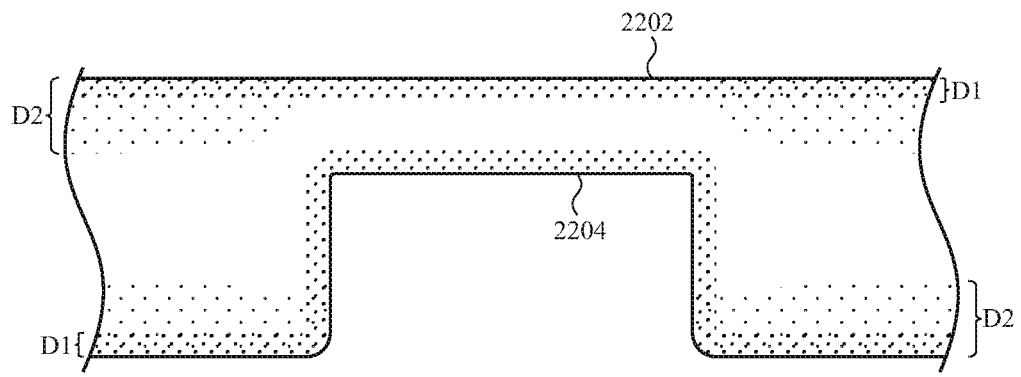
FIG. 22 illustrates a cross-sectional view of a sheet component with a locally thinned region which has been chemically strengthened.
Figure 23:
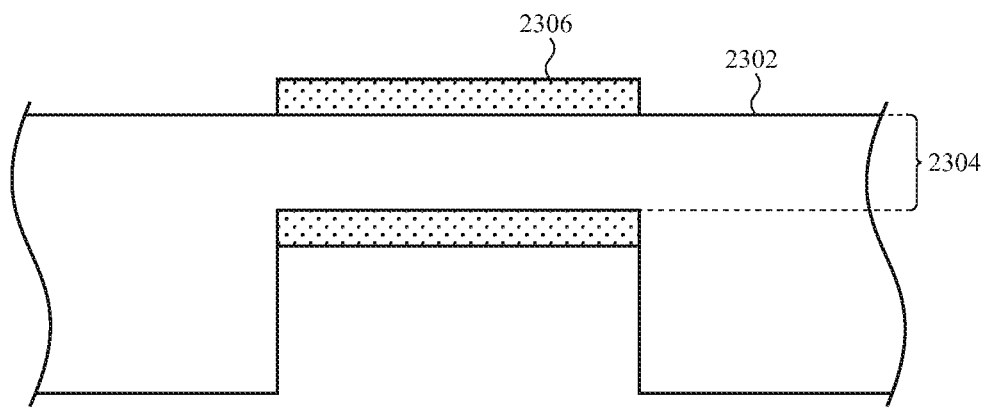
FIG. 23 illustrates masking of the locally thinned regions of the sheet component shown in FIG. 22.

In some embodiments, a sheet component is selectively strengthened so that some portions of the sheet component are strengthened to a greater extent than others. For example, thinner portions of sheet components can be strengthened to a shallower depth than thicker portions. FIG. 22 illustrates a cross-sectional view of a sheet component 2202 with a relief feature 2204 which has been chemically strengthened. As described with respect to the embodiments of FIGS. 14A-20C above, the relief feature may create a localized thinning of the sheet component and facilitate bending or folding of the sheet component. The depth D1 of the chemically strengthened layer in the locally thinned portion is less than the depth D2 in the adjoining portions. The smaller depth of layer in the locally thinner portion can limit the tension in the central portions of the locally thinned portion. For the purposes of comparison, the layer depth D1 is also shown in the other portion of sheet component 2202. FIG. 23 illustrates masking of the locally thinned portions 2304 of a sheet component 2302 with mask 2306. After chemical strengthening of the rest of the sheet component, the mask 2306 can be removed and the whole sheet component then chemically strengthened. Such a process can provide the chemical strengthening depth profiles of FIG. 22. The location of the chemically strengthened layer is indicated with dot patterns in FIG. 22; the higher density of the dot pattern near the surfaces of the sheet component schematically illustrates a higher concentration of ions introduced through ion exchange near the surfaces.

Figure 24A:
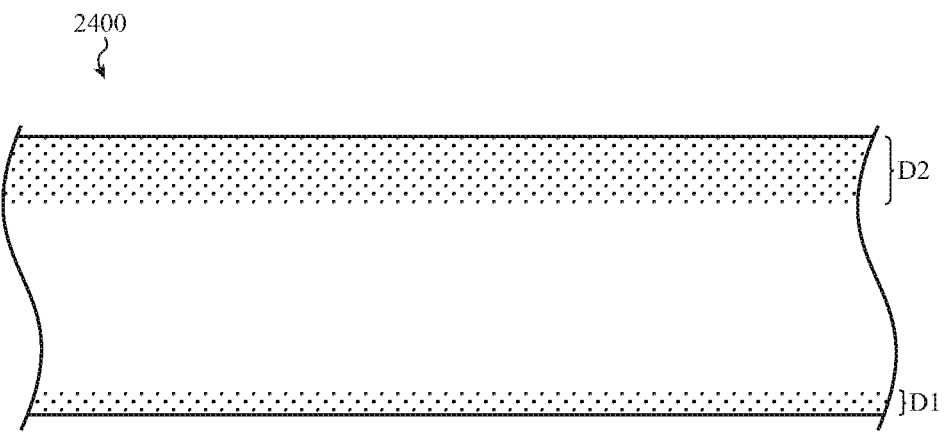
FIGS. 24A and 24B illustrate strengthening of different sides of a sheet component to different depths.
Figure 24B:
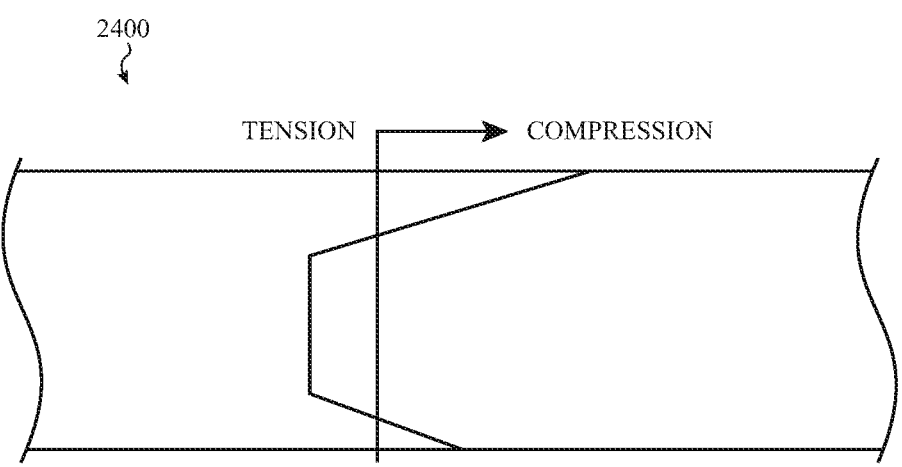

Another example of selective strengthening is illustrated by FIG. 24A, which shows a shallower compressive stress layer D1 on the bottom of sheet component 2400 and a deeper compressive layer D2 on the top of sheet component 2400. As in FIG. 22, the location of the chemically strengthened layer is indicated with a dot pattern in FIG. 24A. FIG. 24B schematically illustrates the asymmetric compressive stress levels along the thickness of the sheet component. The chemical strengthening depth profile illustrated in FIG. 24A can also be obtained using a masking technique.

Figure 25:
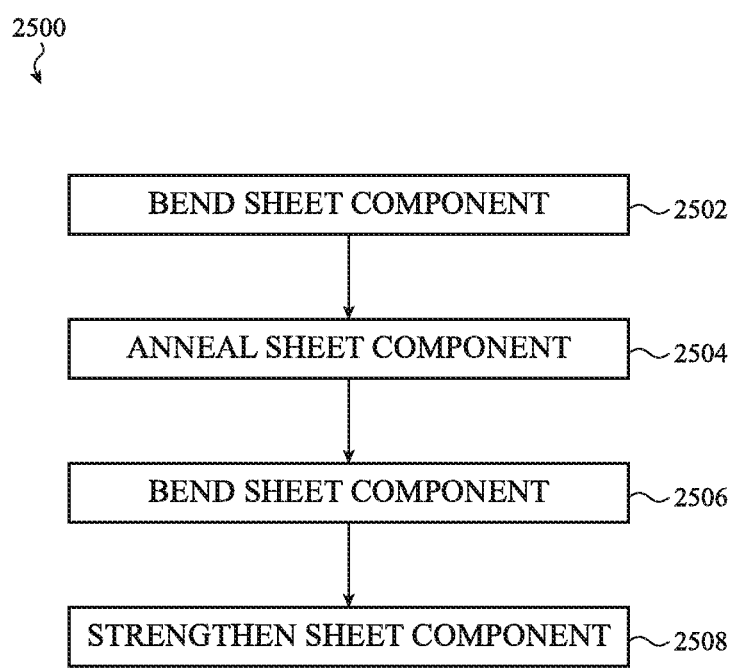
FIG. 25 is a flowchart providing an example of a method for producing a chemically strengthened preformed cover glass.

FIG. 25 is a flowchart providing an example process 2500 for producing a flexible bendable sheet component. In accordance with the embodiments described herein, the sheet component may be used to form a cover layer for an electronic device. In particular, the process 2500 may be used to form a pre-shaped sheet component. When the pre-shaped sheet component is used in an electronic device, a reduced stress condition may be produced when the electronic device is in the fully folded or fully unfolded configuration. In some embodiments, at least a portion of the pre-shaped sheet component has a reduced stress condition or a minimum stress condition when in an intermediate configuration (as compared to a fully folded or fully unfolded configuration). In addition, the reduced stress condition can be assessed by comparing the magnitude of the stress at an inner portion and/or an outer portion of the foldable region in the intermediate preformed configuration to the magnitude of the stress at the corresponding inner portion and/or outer portion of the foldable region in the fully folded and/or fully unfolded configuration. For example, when the outer portion of the foldable region has a compressive stress in the unfolded configuration and a tensile stress in the folded configuration, the magnitude of the stress in the outer portion in the intermediate configuration may be less than the magnitude of the stresses in this portion in either the unfolded or folded configuration.

In operation 2502, the sheet component is bent into a preformed or preliminary shape or configuration. In some cases, the sheet component may be heated to increase the pliability or flexibility of the part while forming. Example techniques for bending the sheet component are provided above in, for example, FIGS. 9A-11B. In some instances, the operation 2502 is performed on a substrate, such as a glass sheet. The glass sheet may include one or more relief features, as described above with respect to FIGS. 14A-20C.

The temperature of a ceramic sheet component may be elevated to facilitate bending. For inorganic glasses, plots of viscosity versus temperature can be used to identify points relevant to deformation of the glass. For example, the strain point (viscosity of about $10^{14.5}$ Poise) is the temperature at which internal stress in the glass is relieved in hours. The annealing point (viscosity of about $10^{13.4}$ Poise) is the temperature at which internal stress in the glass is relieved in minutes. The glass transition temperature (viscosity of about $10^{13}$ Poise) is the temperature at which glass transitions from super-cooled liquid to glassy state. The softening point is defined by a viscosity of about $10^{7.6}$ Poise while the working point is defined by a viscosity of about $10^4$ Poise. For crystalline ceramics, an annealing temperature range may be defined at which substantial stress relaxation occurs. An example temperature range for alumina may be from approximately 1700° C. to approximately 1950° C.

In embodiments, a glass sheet is heated to a temperature above the strain temperature, at or above an annealing temperature, or at or above a glass transition temperature. In further embodiments, the glass sheet is heated to a temperature at or below the working temperature, at or below a softening temperature, or at or below an annealing temperature. These ranges may be combined, so that, for example, the glass sheet may be heated at or above an annealing temperature and at or below a softening temperature. In other embodiments, a ceramic sheet other than a glass sheet is heated to a temperature at or above an annealing temperature and less than a melting temperature.

In operation 2504, the sheet component may be annealed. In particular, the sheet component may be heated above a threshold temperature and held above that temperature allowing the glass to flow and reduce the residual stresses within the foldable or bend region. As stated previously, the residual stresses may be reduced or eliminated, depending on the extent of the annealing operation. In some instances, the bending operation of 2502 and the annealing operation of 2504 can overlap, as in a hot forming process.

In operation 2506, the sheet component may be further bent or folded in preparation for the chemical strengthening of operation 2508. For example, the sheet component may be further unfolded to have a greater bend angle or further folded to have a lesser bend angle and held while performing the chemical strengthening operation of 2508. This is an optional operation that corresponds to the technique discussed above with respect to FIGS. 12A-12C.

In operation 2508, the sheet component may be chemically strengthened. As discussed previously, the chemical strengthening can be performed while the sheet component is in the preformed shape or in a further folded (or further unfolded) shape in accordance with operation 2506, above. The chemical strengthening of operation 2508 may produce a substantially uniform compressive stress in the sheet component. Alternatively, the chemical strengthening may produce an asymmetric or varying compressive stress layer(s) in accordance with the techniques described above with respect to FIGS. 22-24B.

After the last step in the process, the pre-shaped sheet component defines a foldable region. In embodiments, the foldable region includes at least a portion of a bend region of the preliminary or preformed shape of the sheet component. In further embodiments, a preliminary shape of the sheet component includes at least two bend regions so that at least two foldable regions are produced in the pre-shaped sheet component.

Figure 26:
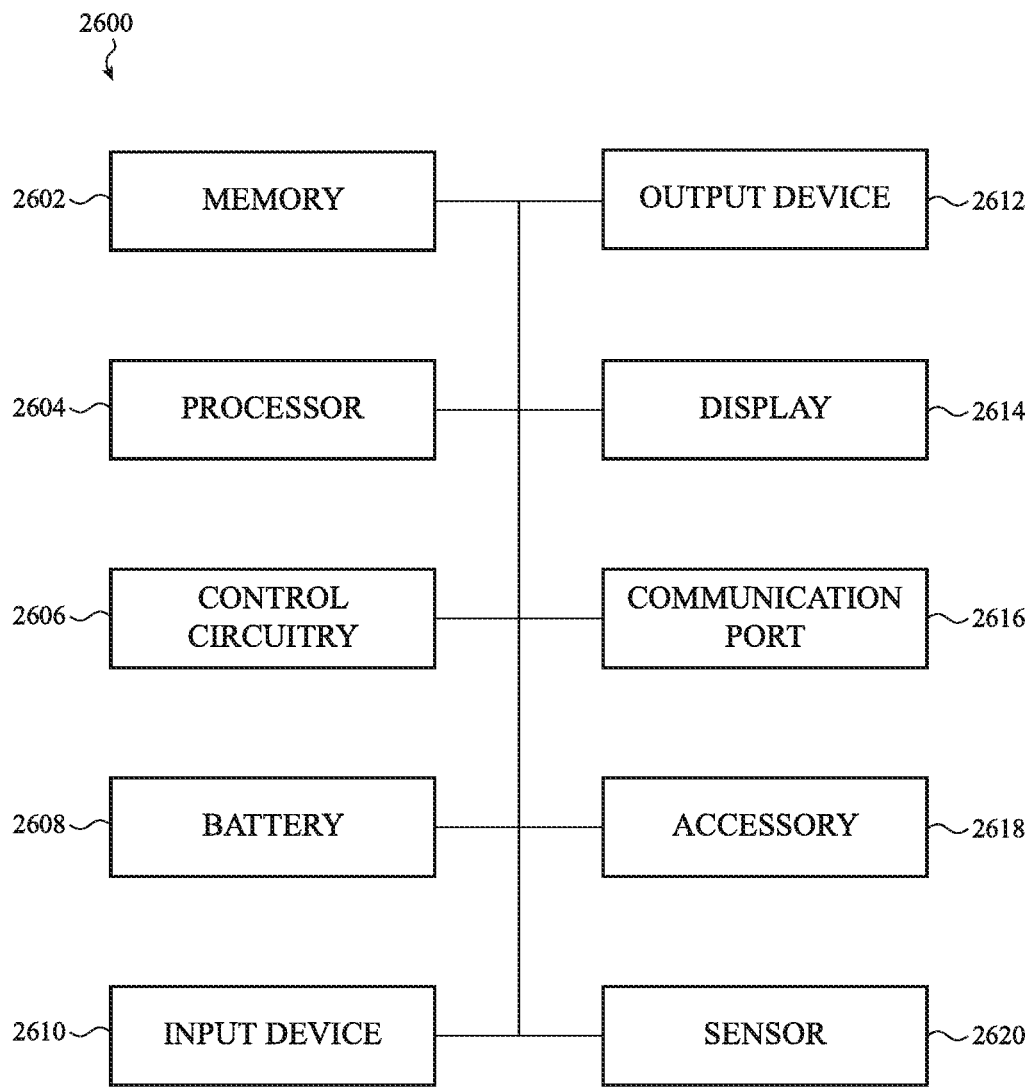
FIG. 26 shows a block diagram of components of an electronic device.

FIG. 26 is a block diagram of example components of an example electronic device that may include a bendable or flexible layer as described herein. The schematic representation depicted in FIG. 26 may correspond to components of the devices depicted in FIGS. 1-26, described above. However, FIG. 26 may also more generally represent other types of electronic devices with a bendable or flexible layer incorporating a foldable region. Internal components of the electronic device may extend across the foldable region and may be flexible themselves. For example, electronic devices with a bendable or flexible cover layer may include other flexible components such as a flexible display, a flexible circuit board, a flexible battery, and combinations thereof.

In embodiments, an electronic device with a bendable cover region and flexible display may also include sensors 2620 to provide information regarding configuration and/or orientation of the electronic device in order to control the output of the display. For example, a portion of the display 2614 may be turned off, disabled, or put in a low energy state when a folded or partially folded configuration of the device 2600 results in all or part of the viewable area of the display 2614 being blocked or substantially obscured. As another example, the display 2614 may be adapted to rotate the display of graphical output based on changes in orientation of the device 2600 (e.g., 90 degrees or 180 degrees) in response to the device 2600 being rotated. As another example, the display 2614 may be adapted to rotate the display of graphical output in response to the device 2600 being folded or partially folded, which may result in a change in the aspect ratio or a preferred viewing angle of the viewable area of the display 2614.

The electronic device 2600 also includes a processor 2604 operably connected with a computer-readable memory 2602. The processor 2604 may be operatively connected to the memory 2602 component via an electronic bus or bridge. The processor 2604 may be implemented as one or more computer processors or microcontrollers configured to perform operations in response to computer-readable instructions. The processor 2604 may include a central processing unit (CPU) of the device 2600. Additionally and/or alternatively, the processor 2604 may include other electronic circuitry within the device 2600 including application specific integrated chips (ASIC) and other microcontroller devices. The processor 2604 may be configured to perform functionality described in the examples above. In addition, the processor or other electronic circuitry within the device may be provided on or coupled to a flexible circuit board in order to accommodate folding or bending of the electronic device. A flexible circuit board may be a laminate including a flexible base material and a flexible conductor. Example base materials for flexible circuit boards include, but are not limited to, polymer materials such as vinyl (e.g., polypropylene), polyester (e.g., polyethylene terephthalate (PET), biaxially-oriented PET, and polyethylene napthalate (PEN)), polyimide, polyetherimide, polyaryletherketone (e.g., polyether ether ketone (PEEK)), fluoropolymer and copolymers thereof. A metal foil may be used to provide the conductive element of the flexible circuit board.

The memory 2602 may include a variety of types of non-transitory computer-readable storage media, including, for example, read access memory (RAM), read-only memory (ROM), erasable programmable memory (e.g., EPROM and EEPROM), or flash memory. The memory 2602 is configured to store computer-readable instructions, sensor values, and other persistent software elements The electronic device 2600 may include control circuitry 2606. The control circuitry 2606 may be implemented in a single control unit and not necessarily as distinct electrical circuit elements. As used herein, "control unit" will be used synonymously with "control circuitry." The control circuitry 2606 may receive signals from the processor 2604 or from other elements of the electronic device 2600.

As shown in FIG. 26, the electronic device 2600 includes a battery 2608 that is configured to provide electrical power to the components of the electronic device 2600. The battery 2608 may include one or more power storage cells that are linked together to provide an internal supply of electrical power. The battery 2608 may be operatively coupled to power management circuitry that is configured to provide appropriate voltage and power levels for individual components or groups of components within the electronic device 2600. The battery 2608, via power management circuitry, may be configured to receive power from an external source, such as an alternating current power outlet. The battery 2608 may store received power so that the electronic device 2600 may operate without connection to an external power source for an extended period of time, which may range from several hours to several days. The battery may be flexible to accommodate bending or flexing of the electronic device. For example, the battery may be mounted to a flexible housing or may be mounted to a flexible printed circuit. In some cases, the battery is formed from flexible anodes and flexible cathode layers and the battery cell is itself flexible. In some cases, individual battery cells are not flexible, but are attached to a flexible substrate or carrier that allows an array of battery cells to bend or fold around a foldable region of the device.

In some embodiments, the electronic device 2600 includes one or more input devices 2610. The input device 2610 is a device that is configured to receive input from a user or the environment. The input device 2610 may include, for example, a push button, a touch-activated button, a touch screen (e.g., a touch-sensitive display or a force-sensitive display), capacitive touch button, dial, crown, or the like. In some embodiments, the input device 2610 may provide a dedicated or primary function, including, for example, a power button, volume buttons, home buttons, scroll wheels, and camera buttons.

The device 2600 may also include one or more sensors 2620, such as a force sensor, a capacitive sensor, an accelerometer, a barometer, a gyroscope, a proximity sensor, a light sensor, or the like. The sensors 2620 may be operably coupled to processing circuitry. In some embodiments, the sensors 2620 may detect deformation and/or changes in configuration of the electronic device and be operably coupled to processing circuitry which controls the display based on the sensor signals. In some implementations, output from the sensors 2620 is used to reconfigure the display output to correspond to an orientation or folded/unfolded configuration or state of the device. Example sensors 2620 for this purpose include accelerometers, gyroscopes, magnetometers, and other similar types of position/orientation sensing devices. In addition, the sensors 2620 may include a microphone, acoustic sensor, light sensor, optical facial recognition sensor, or other types of sensing device.

In some embodiments, the electronic device 2600 includes one or more output devices 2612 configured to provide output to a user. The output device may include display 2614 that renders visual information generated by the processor 2604. The output device may also include one or more speakers to provide audio output.

The display 2614 may include a liquid-crystal display (LCD), light-emitting diode, organic light-emitting diode (OLED) display, an active layer organic light emitting diode (AMOLED) display, organic electroluminescent (EL) display, electrophoretic ink display, or the like. If the display 2614 is a liquid-crystal display or an electrophoretic ink display, the display may also include a backlight component that can be controlled to provide variable levels of display brightness. If the display 2614 is an organic light-emitting diode or organic electroluminescent type display, the brightness of the display 2614 may be controlled by modifying the electrical signals that are provided to display elements. In addition, information regarding configuration and/or orientation of the electronic device may be used to control the output of the display as described with respect to input devices 2610.

The display may be configured to bend or fold along a flexible or bendable region of a foldable electronic device. The display may include or be integrated with various layers, including, for example, a display element layer, display electrode layers, a touch sensor layer, a force sensing layer, and the like, each of which may be formed using flexible substrates. For example, a flexible substrate may comprise a polymer having sufficient flexibility to allow bending or folding of the display layer. Suitable polymer materials include, but are not limited to, vinyl polymers (e.g., polypropylene), polyester (e.g., polyethylene terephthalate (PET), biaxially-oriented PET, and polyethylene napthalate (PEN)), polyimide, polyetherimide, polyaryletherketone (e.g., polyether ether ketone (PEEK)), fluoropolymers and copolymers thereof. Metallized polymer films, such Mylar®, may also provide flexible substrates.

The electronic device 2600 may also include a communication port 2616 that is configured to transmit and/or receive signals or electrical communication from an external or separate device. The communication port 2616 may be configured to couple to an external device via a cable, adaptor, or other type of electrical connector. In some embodiments, the communication port 2616 may be used to couple the electronic device to a host computer.

The electronic device may also include at least one accessory 2618, such as a camera, a flash for the camera, or other such device. The camera may be connected to other parts of the electronic device such as the control circuitry.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not intended to be exhaustive or to limit the embodiments to the precise forms disclosed. It will be apparent to one of ordinary skill in the art that many modifications and variations are possible in view of the above teachings.

What is claimed is:

1. An electronic device comprising:
   a display layer; and
   a cover layer coupled to the display layer, the display layer and the cover layer defining:
      a first peripheral portion configured to display a first graphical output;
      a central portion configured to display a second graphical output;
      a first foldable portion extending between the first peripheral portion and the central portion and configured to display a third graphical output;
      a second peripheral portion configured to display a fourth graphical output; and
      a second foldable portion extending between the second peripheral portion and the central portion and configured to display a fifth graphical output, wherein:
      in an unfolded configuration of the electronic device, the first and the second peripheral portions are substantially aligned with the central portion and the first, the second, the third, the fourth, and the fifth graphical outputs together produce a coordinated graphical output; and
      in a fully folded configuration of the electronic device, the first and the second peripheral portions overlap the central portion and the second graphical output is viewable along an external surface of the electronic device.

2. The electronic device of claim 1, wherein the electronic device further comprises:
   a sensor configured to provide an output indicating a configuration of the electronic device; and
   processing circuitry operatively coupled to the sensor and the display layer and configured to control at least one of the first, the second, the third, the fourth, and the fifth graphical outputs based on the output from the sensor.

3. The electronic device of claim 1, wherein the first graphical output is viewable when the electronic device is in the fully folded configuration.

4. The electronic device of claim 3, wherein the third graphical output is viewable when the electronic device is in the fully folded configuration.

5. The electronic device of claim 1, wherein the first foldable portion comprises:
a glass layer defining a relief feature comprising a locally thinned region; and
a filler disposed in the relief feature and optically matched to the glass layer.

6. The electronic device of claim 1, wherein:
the first foldable portion comprises a glass layer; and
the glass layer has a minimum magnitude of bending-induced stress in an intermediate configuration of the electronic device between the unfolded configuration and the fully folded configuration.

7. The electronic device of claim 6, wherein the glass layer is chemically strengthened through ion exchange.

8. An electronic device comprising:
a display layer; and
a cover layer coupled to the display layer and defining:
a first peripheral portion;
a central portion;
a first foldable portion between the first peripheral portion and the central portion and including a glass material;
a second peripheral portion; and
a second foldable portion between the second peripheral portion and the central portion and including the glass material, wherein:
the display layer and the cover layer are configured to be moved between a fully folded configuration and an unfolded configuration by bending the cover layer along the first and the second foldable portions;
each of the first peripheral portion and the second peripheral portion extends over the central portion in the fully folded configuration; and
an external surface of the first foldable portion defines a first radius of curvature and an external surface of the second foldable portion defines a second radius of curvature, different than the first radius of curvature, in the fully folded configuration.

9. The electronic device of claim 8, wherein the first foldable portion is configured to move between an unfolded state in which the first peripheral portion is coplanar with the central portion and a fully folded state in which the first peripheral portion extends over the central portion.

10. The electronic device of claim 9, wherein:
the first peripheral portion has a folded orientation when the first foldable portion is in the fully folded state;
the first peripheral portion has an unfolded orientation when the first foldable portion is in the unfolded state; and
the folded orientation differs by 180 degrees with respect to the unfolded orientation.

11. The electronic device of claim 9, wherein:
the external surface of the first foldable portion further defines a third radius of curvature, greater than the first radius of curvature, in the unfolded state; and
the external surface of the first foldable portion has a minimum magnitude of bending-induced stress at a fourth radius of curvature greater than the first radius of curvature and less than the third radius of curvature.

12. The electronic device of claim 11, wherein:
an internal surface of the first foldable portion faces the display layer; and
the internal surface and the external surface of the first foldable portion are symmetrically chemically strengthened.

13. The electronic device of claim 8, wherein
the second radius of curvature is greater than the first radius of curvature.

14. The electronic device of claim 8 wherein:
the electronic device further comprises a housing; and
the housing defines an external surface of the electronic device when the display layer and the cover layer are in the fully folded configuration.

15. A foldable computing device comprising:
a display layer;
a glass cover layer coupled to the display layer and defining:
a first peripheral portion;
a central portion;
a first foldable portion joining the first peripheral portion to the central portion;
a second peripheral portion; and
a second foldable portion joining the second peripheral portion and the central portion, and
a housing coupled to the glass cover layer, wherein:
the foldable computing device is configured to be moved between a fully folded configuration and an unfolded configuration by bending the display layer, the glass cover layer, and the housing along the first and the second foldable portions;
the first foldable portion defines a first fold and the second foldable portion defines a second fold in the fully folded configuration; and
a surface of the first foldable portion has:
a first magnitude of bending-induced tensile stress in the fully folded configuration, the surface positioned along an exterior region of the first fold;
a second magnitude of bending-induced compressive stress in the unfolded configuration; and
a third magnitude of bending-induced stress, less than the first magnitude of bending-induced tensile stress and the second magnitude of bending-induced compressive stress, in an intermediate configuration between the unfolded configuration and the fully folded configuration.

16. The foldable computing device of claim 15, wherein in the fully folded configuration, one of the first peripheral portion and the second peripheral portion is positioned between the central portion and the other of the first peripheral portion and the second peripheral portion.

17. The foldable computing device of claim 16, wherein a graphical output from the display layer is viewable through the second peripheral portion of the glass cover layer when the foldable computing device is in the fully folded configuration.

18. The foldable computing device of claim 15, wherein the surface is an internal surface of the glass cover layer and faces the display layer.

19. The foldable computing device of claim 18, wherein the internal surface and an external surface of the glass cover layer are chemically strengthened.

20. The foldable computing device of claim 15, wherein the foldable computing device is a foldable tablet device.

* * * * *